(12) United States Patent
Honda et al.

(10) Patent No.: US 7,625,494 B2
(45) Date of Patent: Dec. 1, 2009

(54) PLASMA ETCHING METHOD AND PLASMA ETCHING UNIT

(75) Inventors: Masanobu Honda, Yamanashi-Ken (JP);
Kazuya Nagaseki, Yamanashi-Ken (JP);
Koichiro Inazawa, Yamanashi-Ken (JP);
Shoichiro Matsuyama, Yamanashi-Ken (JP); Hisataka Hayashi, Kanagawa-Ken (JP)

(73) Assignees: Tokyo Electron Limited, Tokyo (JP);
Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 10/860,152

(22) Filed: Jun. 4, 2004

(65) Prior Publication Data

US 2004/0219797 A1 Nov. 4, 2004

(51) Int. Cl.
*H01L 21/00* (2006.01)
*B23K 10/00* (2006.01)
*H05H 1/18* (2006.01)

(52) U.S. Cl. .......................... 216/67; 216/59; 438/714; 438/725; 438/732; 219/121.41; 219/121.43

(58) Field of Classification Search ................. 438/706, 438/710, 714, 723, 724, 725, 715; 216/70
See application file for complete search history.

(56) References Cited

U.S. PATENT DOCUMENTS

| | | | | |
|---|---|---|---|---|
| 4,492,610 A | * | 1/1985 | Okano et al. | 438/729 |
| 4,894,510 A | * | 1/1990 | Nakanishi et al. | 219/121.43 |
| 5,444,207 A | * | 8/1995 | Sekine et al. | 219/121.43 |
| 5,837,615 A | * | 11/1998 | Rostoker | 438/711 |
| 6,171,438 B1 | * | 1/2001 | Masuda et al. | 156/345.27 |
| 6,197,151 B1 | * | 3/2001 | Kaji et al. | 156/345.46 |
| 6,423,242 B1 | * | 7/2002 | Kojima et al. | 216/79 |

(Continued)

FOREIGN PATENT DOCUMENTS

JP 06181187 A * 6/1994

(Continued)

OTHER PUBLICATIONS

Kobayashi et al., Etching Method, Apr. 27, 2001, Computer Generated English Translation of JP 2001-118825, 6 pages.*

(Continued)

*Primary Examiner*—Anita K Alanko
(74) *Attorney, Agent, or Firm*—Smith, Gambrell & Russell, LLP

(57) ABSTRACT

The present invention is a plasma etching method including: an arranging step of arranging a pair of electrodes oppositely in a chamber and making one of the electrodes support a substrate to be processed in such a manner that the substrate is arranged between the electrodes, the substrate having an organic-material film and an inorganic-material film; and an etching step of applying a high-frequency electric power to at least one of the electrodes to form a high-frequency electric field between the pair of the electrodes, supplying a process gas into the chamber to form a plasma of the process gas by means of the electric field, and selectively plasma-etching the organic-material film of the substrate with respect to the inorganic-material film by means of the plasma; wherein a frequency of the high-frequency electric power applied to the at least one of the electrodes is 50 to 150 MHz in the etching step.

14 Claims, 19 Drawing Sheets

U.S. PATENT DOCUMENTS

| | | | |
|---|---|---|---|
| 6,426,477 B1 * | 7/2002 | Koshimizu et al. | 219/121.41 |
| 6,514,377 B1 * | 2/2003 | Morimoto | 156/345.46 |
| 6,518,191 B2 * | 2/2003 | Nakagawa | 438/710 |
| 6,635,185 B2 * | 10/2003 | Demmin et al. | 216/64 |
| 6,642,149 B2 * | 11/2003 | Suemasa et al. | 438/710 |
| 7,419,613 B2 * | 9/2008 | Honda et al. | 216/58 |
| 7,438,783 B2 * | 10/2008 | Miyata et al. | 156/345.46 |
| 7,473,377 B2 * | 1/2009 | Yamaguchi et al. | 216/22 |
| 2001/0034137 A1 * | 10/2001 | Nambu | 438/725 |
| 2002/0011462 A1 * | 1/2002 | Richter et al. | 216/41 |
| 2002/0061654 A1 * | 5/2002 | Kanegae et al. | 438/710 |
| 2004/0076762 A1 * | 4/2004 | Iijima | 427/446 |
| 2004/0085706 A1 * | 5/2004 | Tomoyoshi | 361/234 |

FOREIGN PATENT DOCUMENTS

| | | |
|---|---|---|
| JP | 09-008009 | 1/1997 |
| JP | 2000-173995 | 6/2000 |
| JP | 2000-269196 | 9/2000 |
| JP | 2001-118825 | 4/2001 |
| JP | 2001-118830 | 4/2001 |
| WO | WO 00/79586 | 12/2000 |
| WO | WO 03/049169 | 6/2003 |

OTHER PUBLICATIONS

International Preliminary Examination Report (PCT/IPEA/409 and PCT/IPEA/416) (with translation) issued for PCT/JP2002/012720.
Form PCT/IPEA/401 issued for PCT/JP2002/012720.
International Search Report (PCT/ISA/210) (Jul. 1998) issued for PCT/JP2002/012720.
Notice Informing the Applicant of the Communication of the international Application to the Designated Offices (Form PCT/IB/308) (Apr. 2002) issued for PCT/JP2002/012720.
Notification Concerning Submission or Transmittal of Priority Document (Form PCT/IB/304) issued for PCT/JP2002/012720.
Notification of Receipt of Record (Form PCT/IB/301) (Apr. 2002) issued for PCT/JP2002/012720.
Notification of Transmittal of Translation of the International Preliminary Examination Report (PCT/IB/338) issued for PCT/JP2002/012720.

* cited by examiner

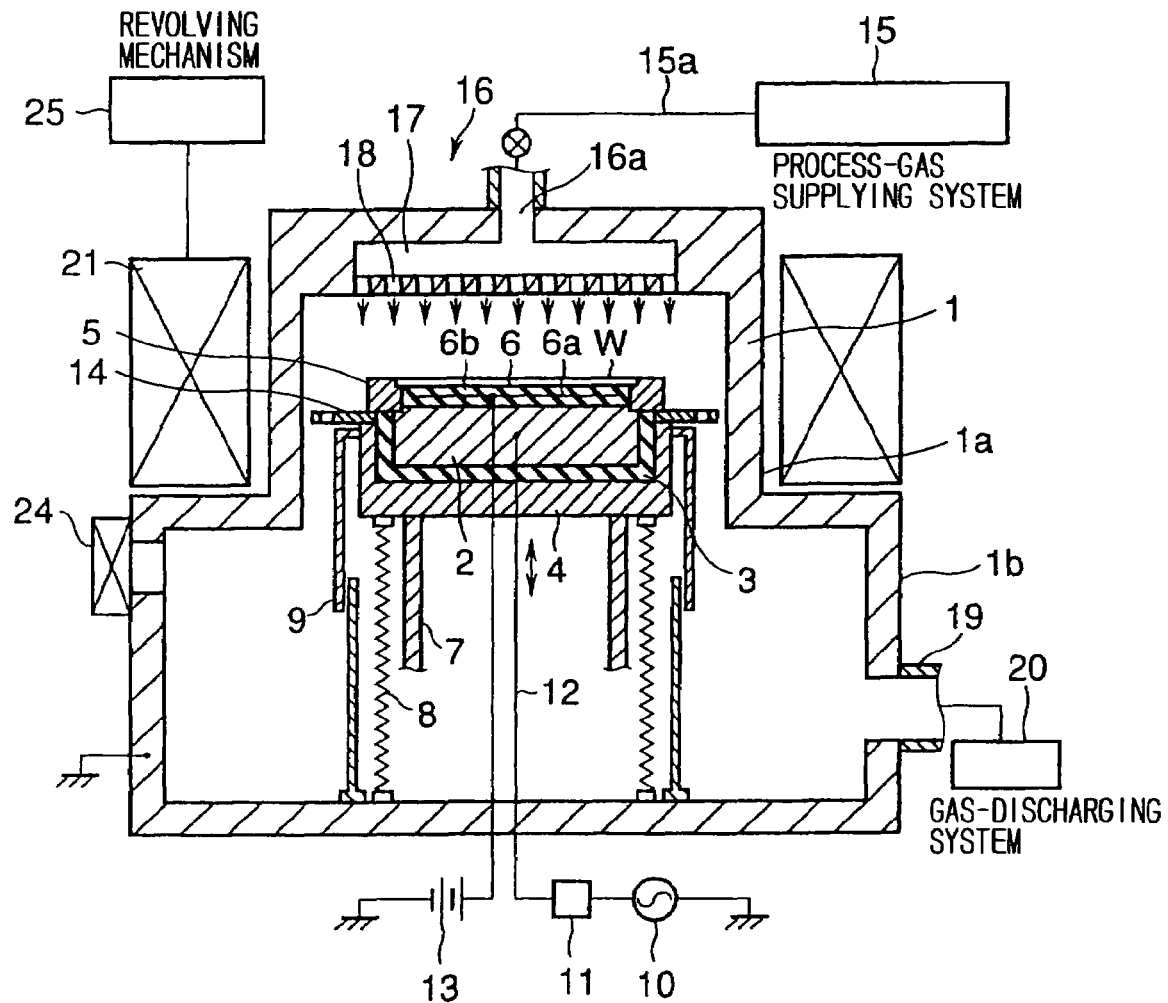
F I G. 1

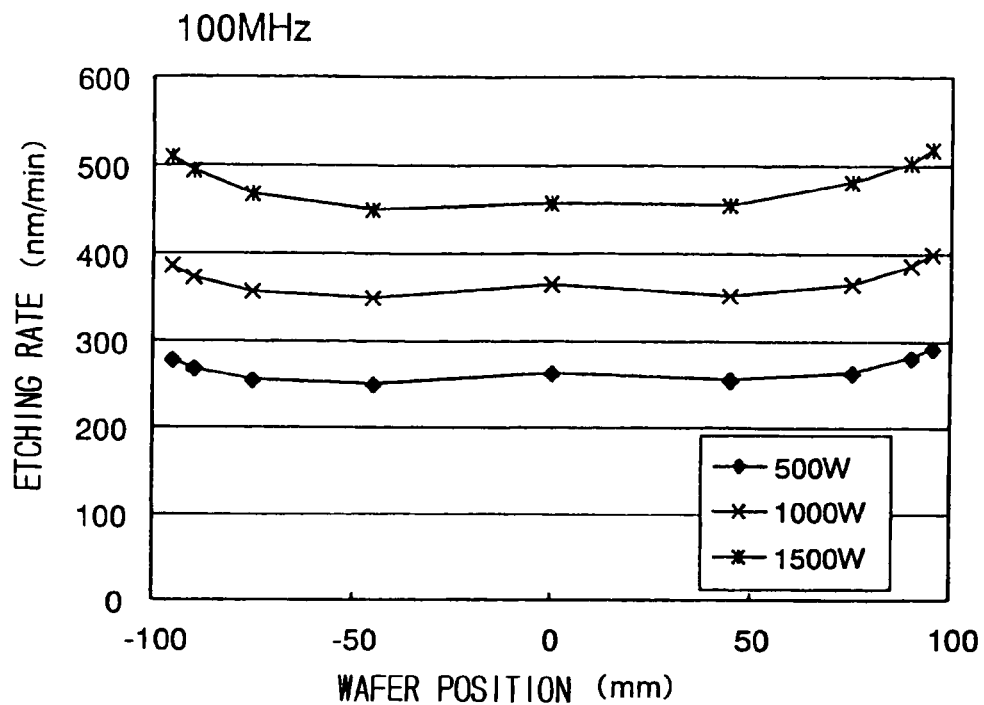
F I G. 13A
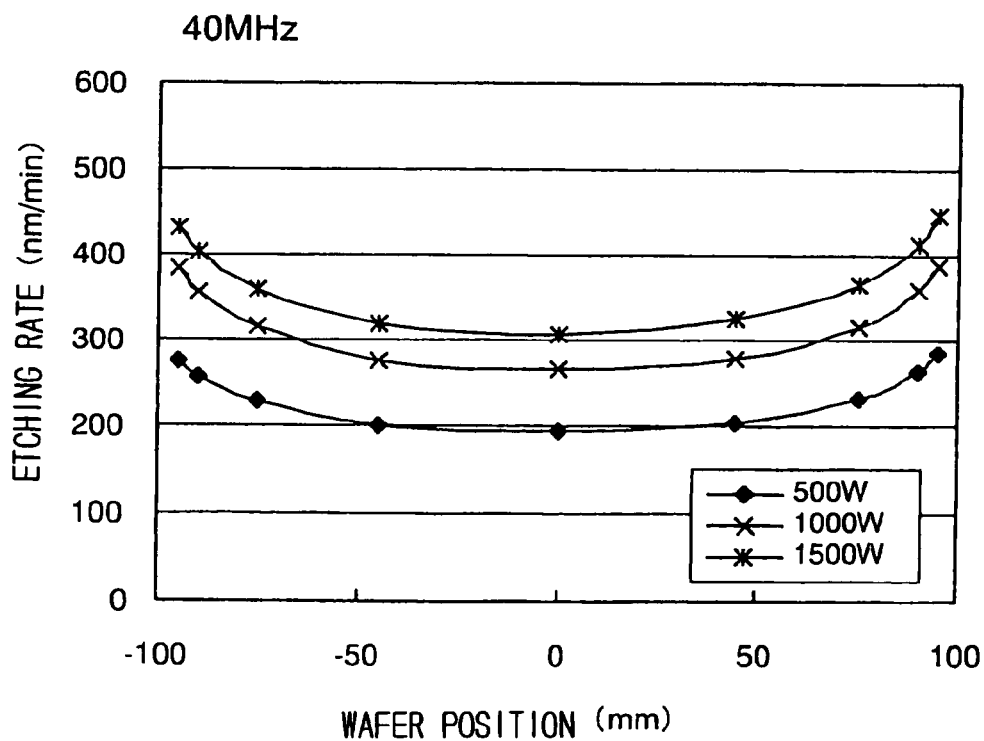
F I G. 13B

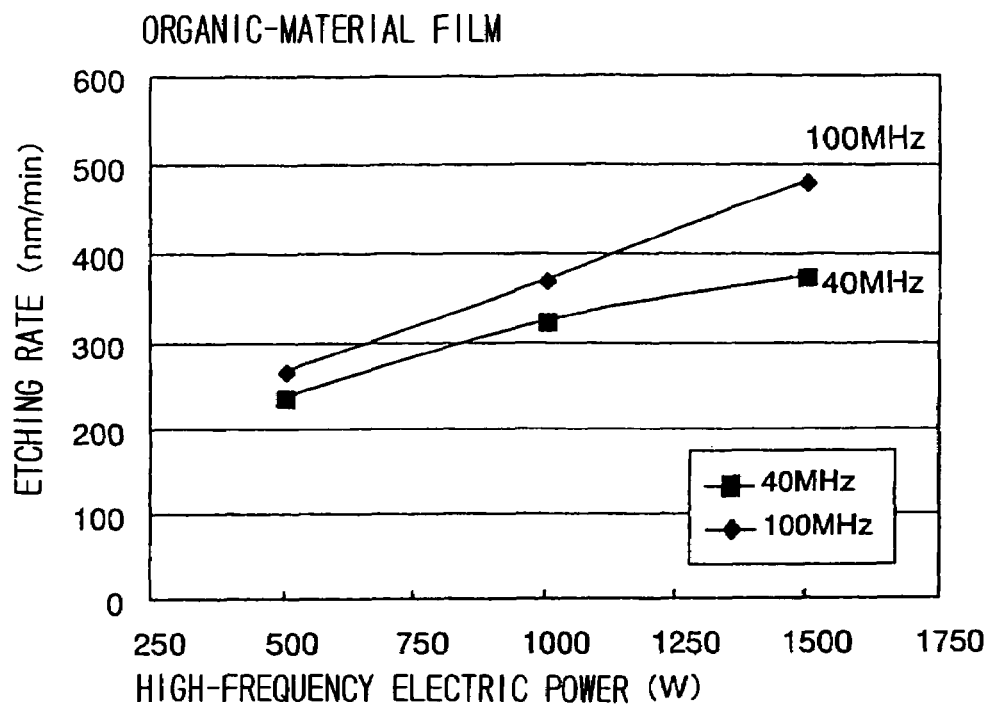
F I G. 14
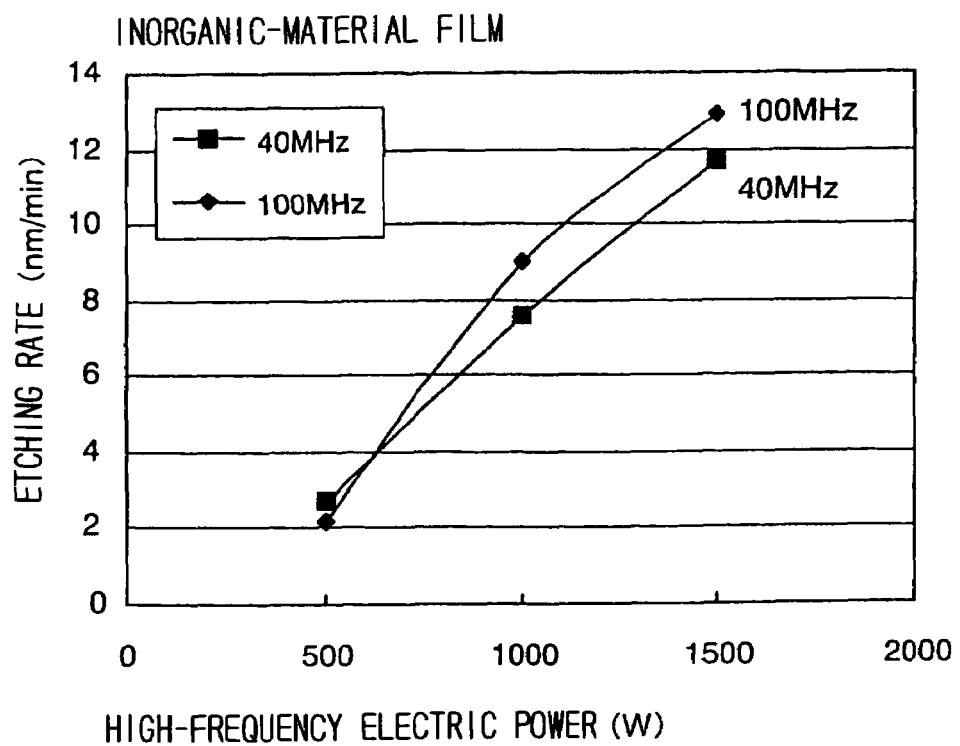
F I G. 15

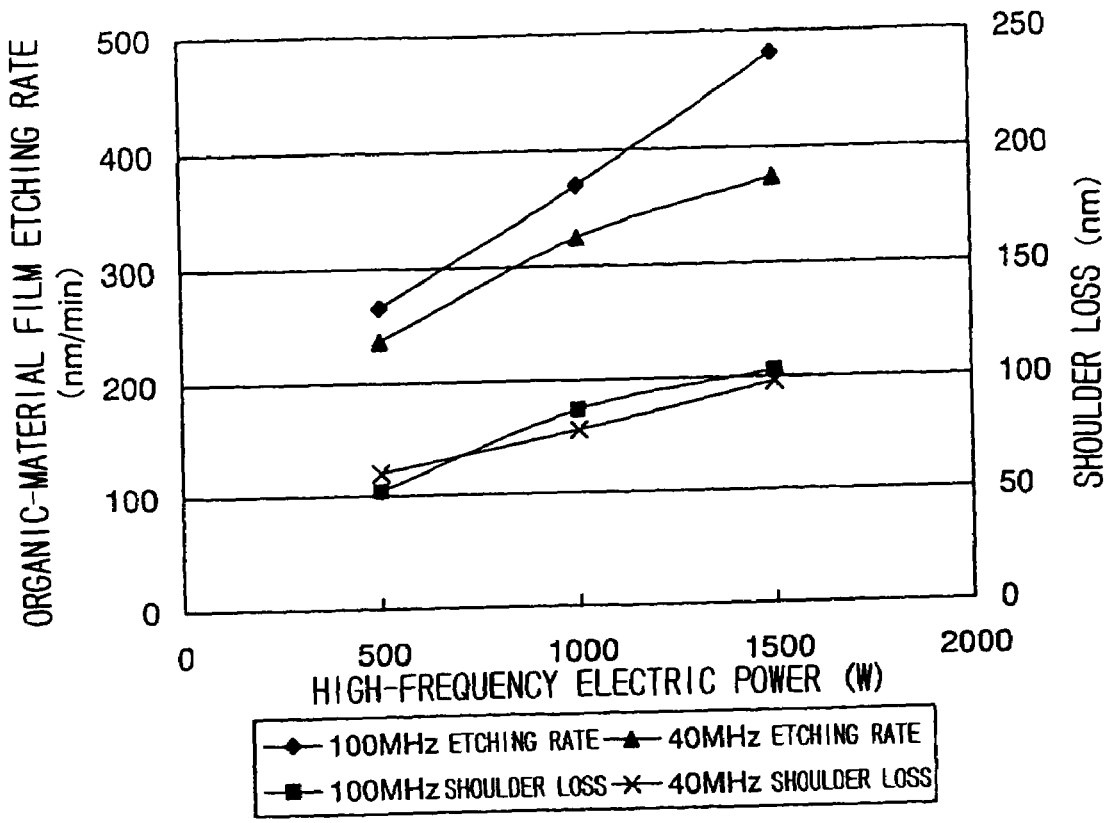
F I G. 17
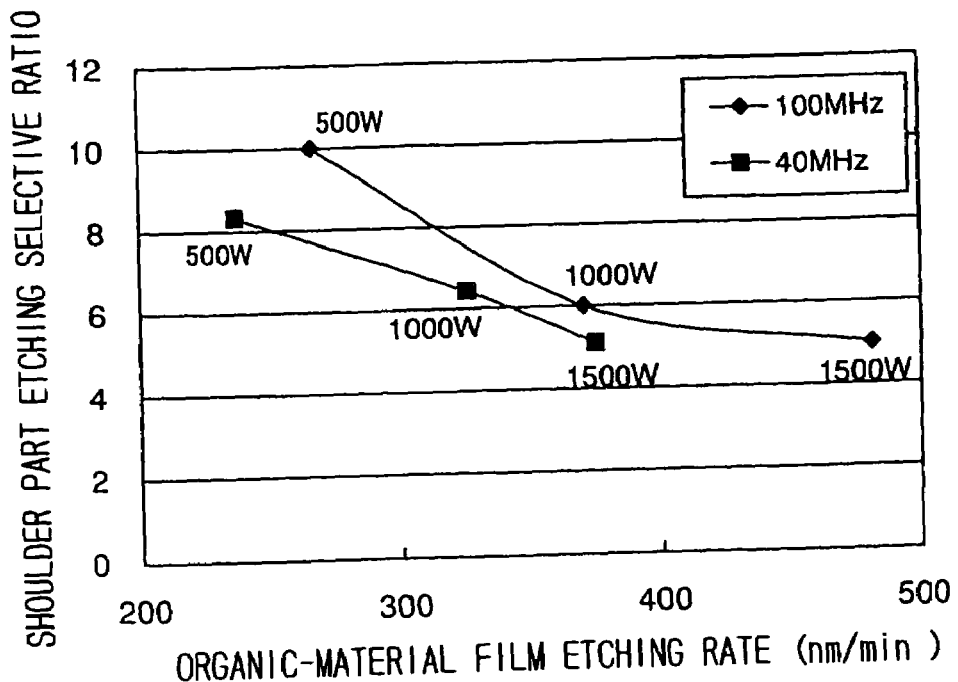
F I G. 18

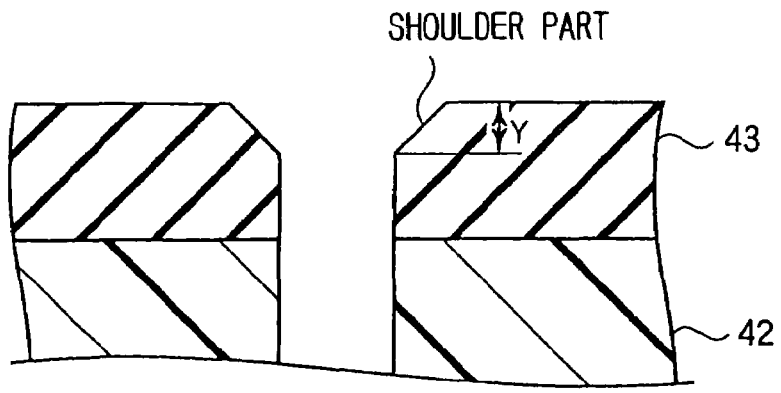
F I G. 19
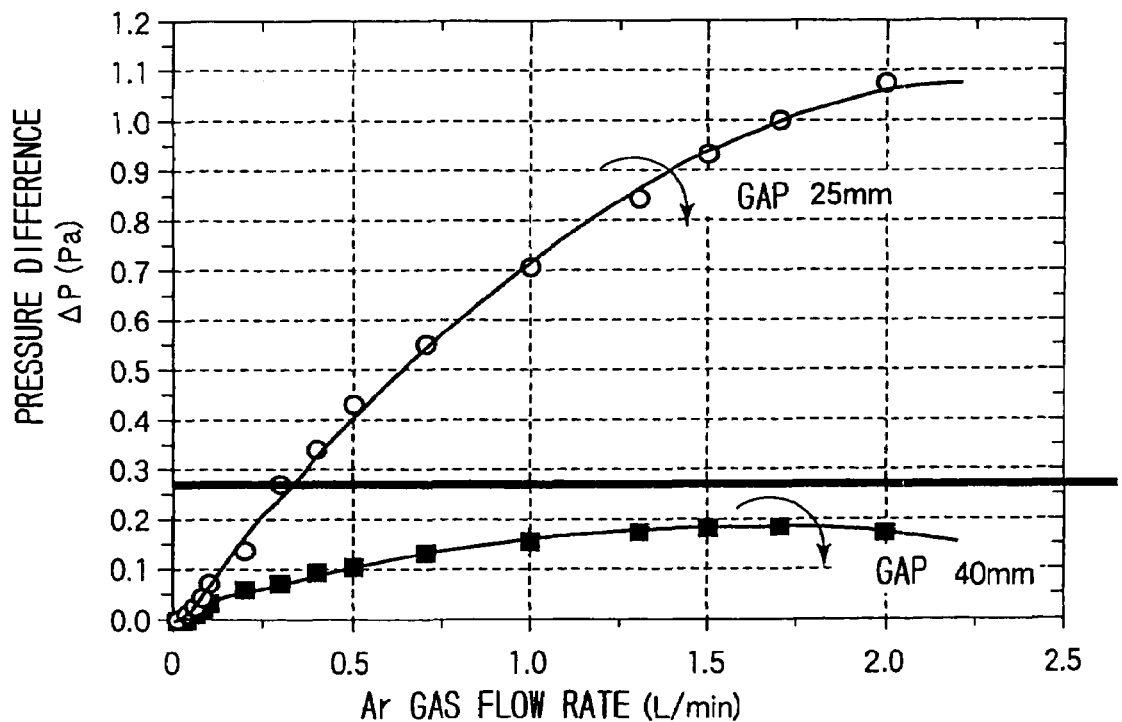
F I G. 20

PLASMA ETCHING METHOD AND PLASMA ETCHING UNIT

FIELD OF THE INVENTION

The present invention relates to a plasma etching method of plasma-etching an organic-material film, such as a low-dielectric-constant film (low-k film), formed on a substrate to be processed, such as a semiconductor wafer, by using an inorganic-material film as a mask.

DESCRIPTION OF THE RELATED ART

In a wiring step of a semiconductor device, an interlayer dielectric film, which has been formed between wiring layers, may be etched in order to electrically connect the wiring layers. Recently, it has been requested to use a film having a lower dielectric constant as the interlayer dielectric film, in order to achieve more speeding-up of the semiconductor device. Some organic-material films have started to be used as such a film having a lower dielectric constant.

Etching process for the organic-material films is carried out by a plasma etching by using an inorganic-material film such as a silicon-oxide film as a mask. Specifically, a pair of opposite electrodes is arranged in a chamber in such a manner that the electrodes are vertically opposite, a semiconductor wafer (hereafter, referred to as a mere "wafer") is placed on a lower electrode, and a high-frequency electric power of about 13.56 to 40 MHz is supplied to the lower electrode to carry out the etching process.

However, under a conventional etching condition, when an organic-material film is etched by using an inorganic-material film as a mask, in order to increase plasma density to achieve a higher etching rate, a self-bias electric voltage has to be raised. However, if the self-bias electric voltage is raised, an etching selective ratio of the organic-material film with respect to the inorganic-material film as a mask may be decreased. That is, under the conventional etching condition, a high etching rate and a high etching selective ratio conflict with each other.

SUMMARY OF THE INVENTION

This invention is developed by focusing the aforementioned problems in order to resolve them effectively. An object of the present invention is to provide a plasma etching method that can etch an organic-material film with a high etching rate and a high etching selective ratio with respect to an inorganic-material film, when the organic-material film is etched by using the inorganic-material film as a mask.

According to a result of study by the inventors, in the etching process of the organic-material film, plasma density is dominant, and ion energy contributes only a little. On the other hand, in the etching process of the inorganic-material film, both the plasma density and the ion energy are necessary. Thus, in order to raise an etching rate of the organic-material film and in order to raise an etching selective ratio of the organic-material film with respect to the inorganic-material film, the plasma density has to be high and the ion energy has to be low to some extent. In the case, the ion energy of the plasma indirectly corresponds to a self-bias electric voltage of an electrode at the etching process. Thus, in order to etch the organic-material film with a high etching rate and a high etching selective ratio, finally, it is necessary to etch the organic-material film under a condition of high plasma density and low bias. According to a further result of study by the inventors, when the frequency of the high-frequency electric power applied to the electrode is high, a condition wherein the plasma density is high and the self-bias electric voltage is small can be generated.

The present invention is a plasma etching method comprising: an arranging step of arranging a pair of electrodes oppositely in a chamber and making one of the electrodes support a substrate to be processed in such a manner that the substrate is arranged between the electrodes, the substrate having an organic-material film and an inorganic-material film; and an etching step of applying a high-frequency electric power to at least one of the electrodes to form a high-frequency electric field between the pair of the electrodes, supplying a process gas into the chamber to form a plasma of the process gas by means of the electric field, and selectively plasma-etching the organic-material film of the substrate with respect to the inorganic-material film by means of the plasma; wherein a frequency of the high-frequency electric power applied to the at least one of the electrodes is 50 to 150 MHz in the etching step.

According to the present invention, since the frequency of the high-frequency electric power applied to the electrode is 50 to 150 MHz, which is higher than prior art, although the plasma has high density, a lower self-bias electric voltage can be achieved. Thus, the organic-material film can be etched with a high etching rate and a high etching selective ratio with respect to the inorganic-material film.

It is more preferable that the frequency of the high-frequency electric power applied to the electrode is 70 to 100 MHz. In addition, it is preferable that plasma density in the chamber is $5 \times 10^{10}$ to $2 \times 10^{11}$ $cm^{-3}$, and that a self-bias electric voltage of an electrode is not higher than 900 V.

In addition, the present invention is a plasma etching method comprising: an arranging step of arranging a pair of electrodes oppositely in a chamber and making one of the electrodes support a substrate to be processed in such a manner that the substrate is arranged between the electrodes, the substrate having an organic-material film and an inorganic-material film; and an etching step of applying a high-frequency electric power to at least one of the electrodes to form a high-frequency electric field between the pair of the electrodes, supplying a process gas into the chamber to form a plasma of the process gas by means of the electric field, and selectively plasma-etching the organic-material film of the substrate with respect to the inorganic-material film by means of the plasma; wherein, in the etching step, plasma density in the chamber is $5 \times 10^{10}$ to $2 \times 10^{11}$ $cm^{-3}$, and a self-bias electric voltage of an electrode is not higher than 900 V.

According to the present invention, since the plasma is generated in a condition wherein the plasma density in the chamber is $5 \times 10^{10}$ to $2 \times 10^{11}$ $cm^{-3}$ and wherein the self-bias electric voltage of an electrode is not higher than 900 V, the organic-material film can be etched with a high etching rate and a high etching selective ratio with respect to the inorganic-material film.

It is preferable that power density of the high-frequency electric power is 2.12 to 4.25 $W/cm^2$.

In addition, it is preferable that a pressure in the chamber is 13.3 to 106.7 Pa or 1.33 to 6.67 Pa.

In addition, it is preferable that the high-frequency electric power is applied to an electrode supporting the substrate to be processed. In the case, a second high-frequency electric power of 500 kHz to 27 MHz may be applied to the electrode supporting the substrate to be processed, the second high-frequency electric power being overlapped with the high-frequency electric power. By overlapping the second high-frequency electric power of a lower frequency with the high-frequency electric power, plasma density and ion drawing effect can be adjusted so that an etching rate of the organic-material film can be raised more while a high etching selective ratio with respect to the inorganic-material film can be assured. It is preferable that a frequency of the second high-frequency electric power is 13.56 MHz or 3.2 MHz. If the frequency of the second high-frequency electric power is 3.2 MHz, it is preferable that power density of the second high-frequency electric power is not higher than 4.25 W/cm$^2$.

In addition, the present invention is a plasma etching method comprising: an arranging step of arranging a pair of electrodes oppositely in a chamber and making one of the electrodes support a substrate to be processed in such a manner that the substrate is arranged between the electrodes, the substrate having an organic-material film and an inorganic-material film; and an etching step of applying a high-frequency electric power to at least one of the electrodes to form a high-frequency electric field between the pair of the electrodes, supplying a process gas into the chamber to form a plasma of the process gas by means of the electric field, and selectively plasma-etching the organic-material film of the substrate with respect to the inorganic-material film by means of the plasma; wherein, in the etching step: a pressure in the chamber is 13.3 to 106.7 Pa; the first high-frequency electric power is applied to an electrode supporting the substrate to be processed; a frequency of the first high-frequency electric power is 50 to 150 MHz; power density of the first high-frequency electric power is 2.12 to 4.25 W/cm$^2$; a second high-frequency electric power is applied to the electrode, the second high-frequency electric power being overlapped with the first high-frequency electric power; a frequency of the second high-frequency electric power is 500 kHz to 27 MHz; power density of the second high-frequency electric power is not higher than 4.25 W/cm$^2$; plasma density in the chamber is $5\times10^{10}$ to $2\times10^{11}$ cm$^{-3}$; and a self-bias electric voltage of an electrode is not higher than 900 V.

According to the above condition, vertical component of ion energy onto the substrate to be processed can be relatively reduced, so that the organic-material film can be etched with a high etching selective ratio with respect to the inorganic-material film and with a high etching rate. In particular, when a hole is etched, a very high etching rate can be achieved while a high etching selective ratio can be maintained.

In addition, the present invention is a plasma etching method comprising: an arranging step of arranging a pair of electrodes oppositely in a chamber and making one of the electrodes support a substrate to be processed in such a manner that the substrate is arranged between the electrodes, the substrate having an organic-material film and an inorganic-material film; and an etching step of applying a high-frequency electric power to at least one of the electrodes to form a high-frequency electric field between the pair of the electrodes, supplying a process gas into the chamber to form a plasma of the process gas by means of the electric field, and selectively plasma-etching the organic-material film of the substrate with respect to the inorganic-material film by means of the plasma; wherein, in the etching step: a pressure in the chamber is 1.33 to 6.67 Pa; the first high-frequency electric power is applied to an electrode supporting the substrate to be processed; a frequency of the first high-frequency electric power is 50 to 150 MHz; power density of the first high-frequency electric power is 2.12 to 4.25 W/cm$^2$; a second high-frequency electric power is applied to the electrode, the second high-frequency electric power being overlapped with the first high-frequency electric power; a frequency of the second high-frequency electric power is 500 kHz to 27 MHz; power density of the second high-frequency electric power is not higher than 0.566 W/cm$^2$; plasma density in the chamber is $5\times10^{10}$ to $2\times10^{11}$ cm$^{-3}$; and a self-bias electric voltage of an electrode is not higher than 400 V.

According to the above condition, ion energy itself can be controlled not higher than energy by which the inorganic-material film can be spattered, so that an etching selective ratio of the organic-material film with respect to the inorganic-material film can be remarkably raised while a high etching rate is maintained. In addition, surface residue is substantially not left. In addition, when the inorganic-material film is used as a mask, a CD-shift of the mask can be remarkably small.

In the above features, as the organic-material film, a material including O, C and H, or another material including Si, O, C and H may be used. As the inorganic-material film, a material comprising at least one of a silicon oxide, a silicon nitride and a silicon oxinitride may be used.

In addition, the present invention is a plasma etching unit comprising: a chamber configured to contain a substrate to be processed having an organic-material film and an inorganic-material film; a pair of electrodes arranged in the chamber, one of the pair of electrodes being configured to support the substrate to be processed; a process-gas supplying system configured to supply a process gas into the chamber; a gas-discharging system configured to discharge a gas in the chamber; and a high-frequency electric power source configured to supply a high-frequency electric power for forming a plasma to at least one of the electrodes; wherein a frequency of high-frequency electric power generated by the high-frequency electric power source is 50 to 150 MHz.

Preferably, the high-frequency electric power source is adapted to apply the high-frequency electric power to an electrode supporting the substrate to be processed. In the case, it is preferable that the plasma etching unit further comprises a second high-frequency electric power source configured to apply a second high-frequency electric power of 500 kHz to 27 MHz to the electrode supporting the substrate to be processed, the second high-frequency electric power being overlapped with the high-frequency electric power. It is preferable that the second high-frequency electric power is of 13.56 MHz or 3.2 MHz.

Herein, because of the Paschen's law, an electric-discharge starting voltage Vs takes a local minimum value (Paschen's minimum value) when a product pd of a gas pressure p and a distance d between the electrodes takes a certain value. The certain value of the product pd that corresponds to the Paschen's minimum value is smaller when the frequency of the high-frequency electric power is higher. Thus, when the frequency of the high-frequency electric power is high, in order to decrease the electric-discharge starting voltage Vs to facilitate and stabilize the electric-discharge effect, the distance d between the electrodes has to be reduced, if the gas pressure p is constant. Thus, in the present invention, it is preferable that the distance between the electrodes is shorter than 50 nm. In addition, when the distance between the electrodes is shorter than 50 mm, residence time of the gas in the chamber can be shortened. Thus, reaction products can be efficiently discharged, and etching stop can be reduced.

In addition, it is preferable that the plasma etching unit further comprises a magnetic-field forming unit configured to form a magnetic field around a plasma region between the pair of electrodes.

When the frequency of the applied high-frequency electric power is high, the etching rate may be higher in a central portion as a feeding position compared with in a peripheral portion. However, if a magnetic field is formed around a plasma region between the pair of electrodes, plasma confining effect can be achieved so that the etching rate on the substrate to be processed arranged in a processing space can be made substantially the same between in an edge portion (peripheral portion) of the substrate to be processed and in a central portion thereof. That is, the etching rate can be made uniform.

It is preferable that strength of the magnetic field formed around a plasma region between the pair of electrodes by the magnetic-field forming unit is 0.03 to 0.045 T (300 to 450 Gauss).

In addition, it is preferable that a focus ring is provided around the electrode supporting the substrate to be processed, and that when the magnetic-field forming unit forms a magnetic field around a plasma region between the pair of electrodes, strength of the magnetic field on the focus ring is not lower than 0.001 T (10 Gauss) and strength of the magnetic field on the substrate to be processed is not higher than 0.001 T.

When the strength of the magnetic field on the focus ring is not lower than 0.001 T, drift movement of electrons may be generated on the focus ring, so that the plasma density around the focus ring is raised to make the plasma density uniform. On the other hand, when the strength of the magnetic field on the substrate to be processed is not higher than 0.001 T, which substantially has no effect on the substrate to be processed, charge-up damage can be prevented.

BRIEF DESCRIPTION OF THE DRAWINGS

FIG. 1 is a schematic vertical sectional view showing a plasma etching unit of an embodiment according to the present invention;

FIG. 13A is a graph showing etching rates of an organic-material film at a wafer position, in samples of respective cases wherein the high-frequency electric power is 500 W, 1000 W or 1500 W, when the frequency of the high-frequency electric power is 100 MHz;

FIG. 13B is a graph showing etching rates of an organic-material film at a wafer position, in samples of respective cases wherein the high-frequency electric power is 500 W, 1000 W or 1500 W, when the frequency of the high-frequency electric power is 40 MHz;

FIG. 14 is a graph showing relationships between a high-frequency electric power and an etching rate of the organic-material film, in samples of respective cases wherein the frequency of the high-frequency electric power is 40 MHz or 100 MHz;

FIG. 15 is a graph showing relationships between a high-frequency electric power and an etching rate of the inorganic-material film, in samples of respective cases wherein the frequency of the high-frequency electric power is 40 MHz or 100 MHz;

FIG. 17 is a graph showing relationships between a high-frequency electric power and an etching rate of the organic-material film and relationships between a high-frequency electric power and an etched volume of a shoulder part of the inorganic-material film (shoulder loss), wherein the real pattern shown in FIG. 9 is used;

FIG. 18 is a graph showing relationships between an etching rate of the organic-material film and an etching selective ratio with respect to an etching rate of the shoulder part of the inorganic-material film, in respective cases wherein the frequency of the high-frequency electric power is 40 MHz or 100 MHz, wherein the real pattern shown in FIG. 9 is used;

FIG. 19 is a view for explaining a shoulder loss;

FIG. 20 is a graph comparatively showing relationships between an Ar-gas flow rate and a pressure difference ΔP of a central portion of the wafer and a peripheral portion thereof, in respective cases wherein an electrode gap is 25 mm or 40 mm, wherein the Ar gas is used as a plasma gas;

DESCRIPTION OF THE PREFERRED EMBODIMENT

Figure 2:
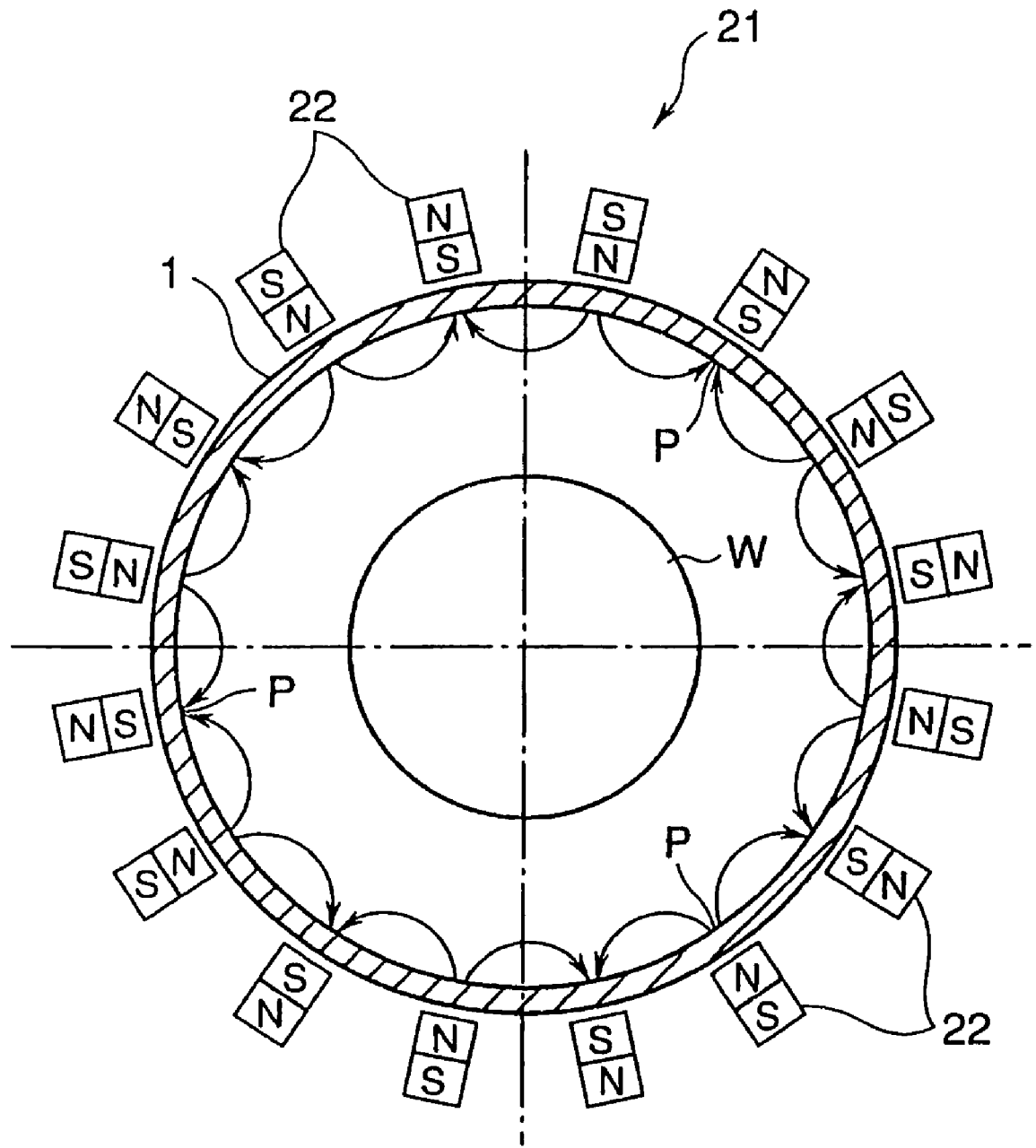
FIG. 2 is a horizontal sectional view schematically showing a magnetic annular unit arranged around a chamber of the plasma etching unit of FIG. 1.

An embodiment of the invention will now be described with reference to the attached drawings.

FIG. 1 is a schematic sectional view showing a plasma etching unit used for carrying out the present invention. The etching unit of the embodiment includes a two-stage cylindrical chamber vessel 1, which has an upper portion 1a having a small diameter and an lower portion 1b having a large diameter. The chamber vessel 1 may be hermetically made of any material, for example aluminum.

A supporting table 2 is arranged in the chamber vessel 1 for horizontally supporting a wafer W as a substrate to be processed. The supporting table 2 may be made of any material, for example aluminum. The supporting table 2 is placed on a conductive supporting stage 4 via an insulation plate 3. A focus ring 5 is arranged on a peripheral area of the supporting table 2. The focus ring 5 may be made of any conductive material or any insulating material. When the diameter of the wafer W is 200 mmϕ, it is preferable that the focus ring 5 is 240 to 280 mmϕ. The supporting table 2, the insulation plate 3, the supporting stage 4 and the focus ring 5 can be elevated by a ball-screw mechanism including a ball-screw 7. A driving portion for the elevation is arranged below the supporting stage 4 and is covered by a bellows 8. The bellows 8 may be made of any material, for example stainless steel (SUS). The chamber vessel 1 is earthed. A coolant passage (not shown) is formed in the supporting table 2 in order to cool the supporting table 2. A bellows cover 9 is provided around the bellows 8.

A feeding cable 12 for supplying a high-frequency electric power is connected to a substantially central portion of the supporting table 2. The feeding cable 12 is connected to a high-frequency electric power source 10 via a matching box 11. A high-frequency electric power of a predetermined frequency is adapted to be supplied from the high-frequency electric power source 10 to the supporting table 2. A showerhead 16 is provided above the supporting table 2 and oppositely in parallel with the supporting table 2. The showerhead 16 is also earthed. Thus, the supporting table 2 functions as a lower electrode, and the showerhead 16 functions as an upper electrode. That is, the supporting table 2 and the showerhead 16 form a pair of plate electrodes.

Herein, it is preferable that the distance between the electrodes is set to be shorter than 50 mm. The reason is as follows.

Because of the Paschen's law, an electric-discharge starting voltage Vs takes a local minimum value (Paschen's minimum value) when a product pd of a gas pressure p and a distance d between the electrodes takes a certain value. The certain value of the product pd that corresponds to the Paschen's minimum value is smaller when the frequency of the high-frequency electric power is higher. Thus, when the frequency of the high-frequency electric power is high like the present embodiment, in order to decrease the electric-discharge starting voltage Vs to facilitate and stabilize the electric-discharge effect, the distance d between the electrodes has to be reduced, if the gas pressure p is constant. Thus, it is preferable that the distance between the electrodes is shorter than 50 mm. In addition, when the distance between the electrodes is shorter than 50 mm, residence time of the gas in the chamber can be shortened. Thus, reaction products can be efficiently discharged, and etching stop can be reduced.

However, if the distance between the electrodes is too short, pressure distribution on the surface of the wafer W as a substrate to be processed (pressure difference between in a central portion and in a peripheral portion) may become large. In the case, problems such as deterioration of etching uniformity may be generated. Independently on gas flow rate, in order to make the pressure difference smaller than 0.27 Pa (2 mTorr), it is preferable that the distance between the electrodes is not shorter than 35 mm.

An electrostatic chuck 6 is provided on an upper surface of the supporting table 2 in order to electrostaticly stick to the wafer W. The electrostatic chuck 6 consists of an insulation plate 6b and an electrode 6a inserted in the insulation plate 6b. The electrode 6a is connected to a direct-current power source 13. Thus, when the power source 13 supplies an electric power to the electrode 6a, the semiconductor wafer W may be stuck to the electrostatic chuck 6 by coulomb force, for example.

The coolant passage not shown is formed in the supporting table 2. The wafer W can be controlled at a predetermined temperature by circulating a suitable coolant in the coolant passage. In order to efficiently transmit heat of cooling from the suitable coolant to the wafer W, a gas-introducing mechanism (not shown) for supplying a He gas onto a reverse surface of the wafer W is provided. In addition, a baffle plate 14 is provided at an outside area of the focus ring 5. The baffle plate 14 is electrically connected to the chamber vessel 1 via the supporting stage 4 and the bellows 8.

The showerhead 16 facing the supporting table 2 is provided in a ceiling of the chamber vessel 1. The showerhead 16 has a large number of gas jetting holes 18 at a lower surface thereof and a gas introducing portion 16a at an upper portion thereof. Then, an inside space 17 is formed between the gas introducing portion 16a and the large number of gas jetting holes 18. The gas introducing portion 16a is connected to a gas supplying pipe 15a. The gas supplying pipe 15a is connected to a process-gas supplying system 15, which can supply a process gas for etching. As the process gas for etching, at least one of an $N_2$ gas, an $H_2$ gas, an $O_2$ gas, a CO gas, an $NH_3$ gas, a $C_xH_y$ gas (x and y are natural numbers) and a rare gas such as Ar or He may be used. For example, a mixed gas of an $N_2$ gas and an $O_2$ gas, or a mixed gas of an $N_2$ gas and an $H_2$ gas may be used.

The process gas is supplied from the process-gas supplying system 15 into the space 17 of the showerhead 16 through the gas supplying pipe 15a and the gas introducing portion 16a. Then, the process gas is jetted from the gas jetting holes 18 in order to etch a film formed on the wafer W.

A discharging port 19 is formed at a part of a side wall of the lower portion 1b of the chamber 1. The discharging port 19 is connected to a gas-discharging system 20 including a vacuum pump. A pressure of an inside of the chamber vessel 1 may be reduced to a predetermined vacuum level by operating the vacuum pump. A transferring port for the wafer W and a gate valve 24 for opening and closing the transferring port are arranged at another upper part of the side wall of the lower portion 1b of the chamber vessel 1.

A magnetic annular unit 21 is concentrically arranged around the upper portion 1a of the chamber vessel 1. Thus, a magnetic field may be formed around a processing space between the supporting table 2 and the showerhead 16. The magnetic annular unit 21 may be caused to revolve around a center axis thereof (along an annular peripheral edge thereof) by a revolving mechanism 25.

The magnetic annular unit 21 has a plurality of segment magnets 22 which are supported by a holder not shown and which are arranged annularly. Each of the plurality of segment magnets 22 consists of a permanent magnet. In the embodiment, 16 segment magnets 22 are arranged annularly (concentrically) in a multi-pole state. That is, in the magnetic annular unit 21, adjacent two segment magnets 22 are arranged in such a manner that their magnetic-pole directions are opposite. Thus, a magnetic line of force is formed between the adjacent two segment magnets 22 as shown in FIG. 2, so that a magnetic field of 0.02 to 0.2 T (200 to 2000 Gauss), preferably 0.03 to 0.045 T (300 to 450 Gauss), is generated only around the processing space. On the other hand, in a region wherein the wafer is placed, a substantially non-magnetic field state is generated. The above strength of the magnetic field is determined because of the following reasons: if the magnetic field is too strong, a fringing field may be caused; and if the magnetic field is too weak, plasma confining effect can not be achieved. Of course, the suitable strength of the magnetic field also depends on the unit structure or the like. That is, the range of the suitable strength of the magnetic field may be different for respective units.

When the above magnetic field is formed around the processing space, strength of the magnetic field on the focus ring 5 is desirably not lower than 0.001 T (10 Gauss). In the case, drift movement of electrons (E×B drift) is generated on the focus ring, so that the plasma density around the wafer is increased, and hence the plasma density is made uniform. On the other hand, in view of preventing charge-up damage of the wafer W, strength of the magnetic field in a portion where the wafer W is positioned is desirably not higher than 0.001 T (10 Gauss).

Herein, the substantially non-magnetic state in a region occupied by the wafer means a state that there is not a magnetic field affecting the etching process in the area occupied by the wafer. That is, the substantially non-magnetic state includes a state that there is a magnetic field not substantially affecting the wafer process.

In the state shown in FIG. 2, a magnetic field whose density is not more than 420 µT (4.2 Gauss) is applied to a peripheral area of the wafer. Thus, plasma confining function can be achieved.

When a magnetic field is formed by the magnetic annular unit of the multi-pole state, wall portions of the chamber 1 corresponding to the magnetic poles (for example, portions shown by P in FIG. 2) may be locally whittled. Thus, the magnetic annular unit 21 may be caused to revolve along the peripheral direction of the chamber by the above revolving mechanism 25. Thus, it is avoided that the magnetic poles are locally abutted (located) against the chamber wall, so that it is prevented that the chamber wall is locally whittled.

Each segment magnet 22 is configured to freely revolve around a perpendicular axis thereof by a segment-magnet revolving mechanism not shown. That is, from a state shown in FIGS. 2 and 3A wherein the magnetic poles of the segment magnets 22 are oriented toward the chamber 1, adjacent two segment magnets 22 revolve synchronously and oppositely through a state shown in FIG. 3B to a state shown in FIG. 3C (every other segment magnet 22 revolves in the same direction). Herein, FIG. 3B shows a state wherein the segment magnets 22 have revolved by 45 degrees, and FIG. 3C shows a state wherein the segment magnets 22 have revolved by 90 degrees.

Figure 3A:
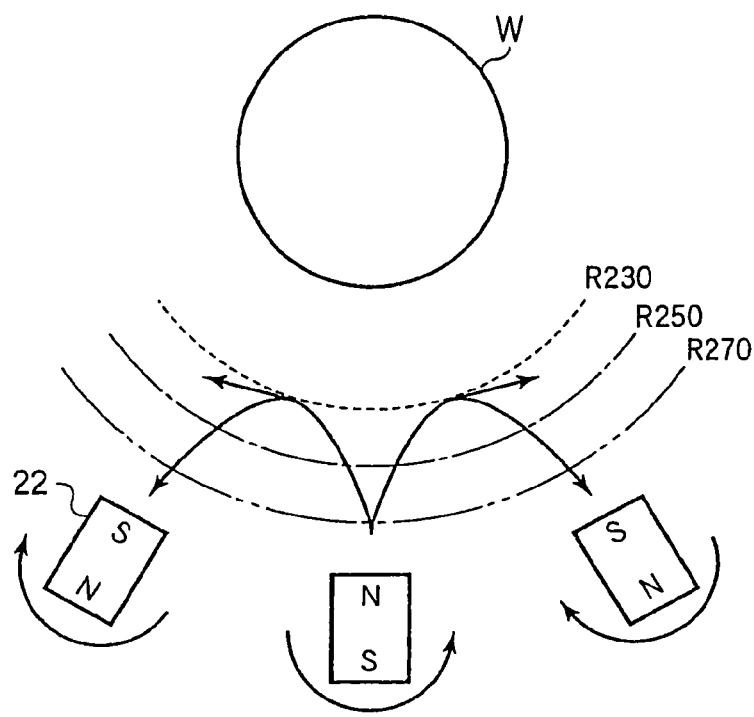
FIGS. 3A to 3C are explanatory views of a change of a magnetic field when segment magnets of the plasma etching unit of FIG. 1 are revolved.
Figure 3B:
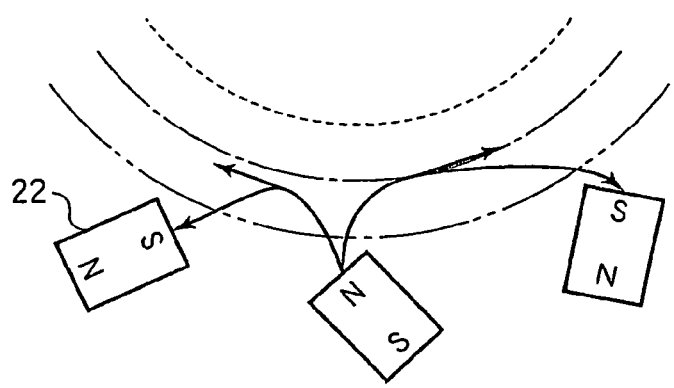
Figure 3C:
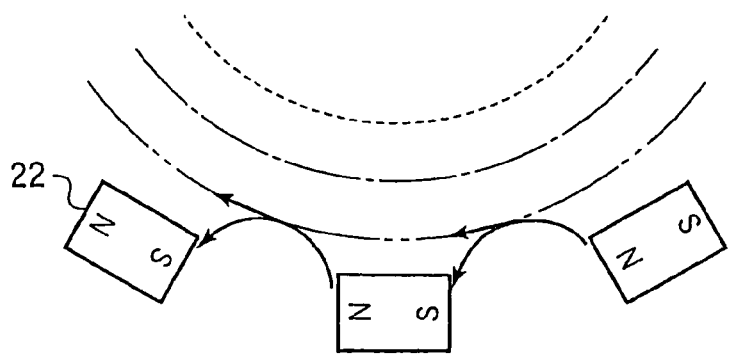
Figure 4:
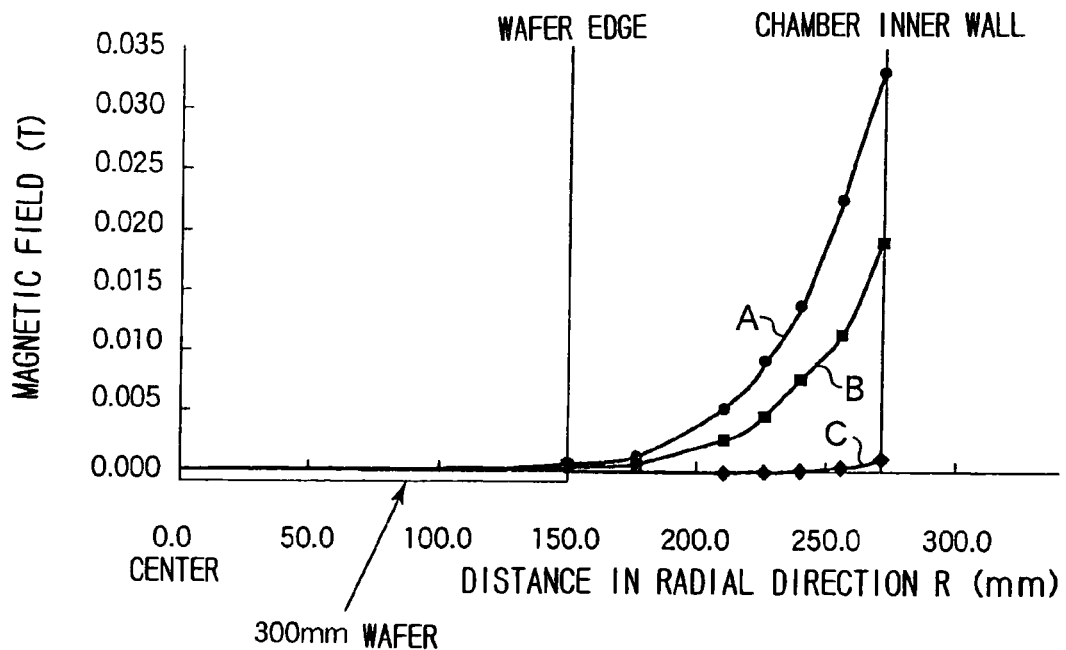
FIG. 4 is a graph showing strengths of magnetic fields when the segment magnets of the plasma etching unit of FIG. 1 are revolved.

FIG. 4 is a graph showing relationships between a distance from the center of the wafer W and strength of the magnetic field, in a case shown in FIG. 3A (curve A), in a case shown in FIG. 3B (curve B) and in a case shown in FIG. 3C (curve C). The transverse axis represents the distance from the center of the wafer W placed on the supporting table 2 in the chamber 1, and the ordinate axis represents the strength of the magnetic field. In the state shown in FIG. 3A, as shown by the curve A, a multi-pole magnetic field is formed substantially to a peripheral portion of the wafer W. On the other hand, in the state shown in FIG. 3C, as shown by the curve C, there is formed substantially no magnetic field in the chamber 1. The state shown in FIG. 3B is a magnetic-field state between them.

That is, when the segment magnets 22 are caused to revolve as shown in FIGS. 3A to 3C, the state wherein the multi-pole magnetic field is substantially formed and the state wherein the multi-pole magnetic field is not formed can be switched. Depending on a kind of film to be etched, the multi-pole magnetic field may be effective or not. Thus, when the state wherein the multi-pole magnetic field is formed and the state wherein the multi-pole magnetic field is not formed can be switched, a suitable etching condition can be selected correspondingly to the film.

Figure 5:
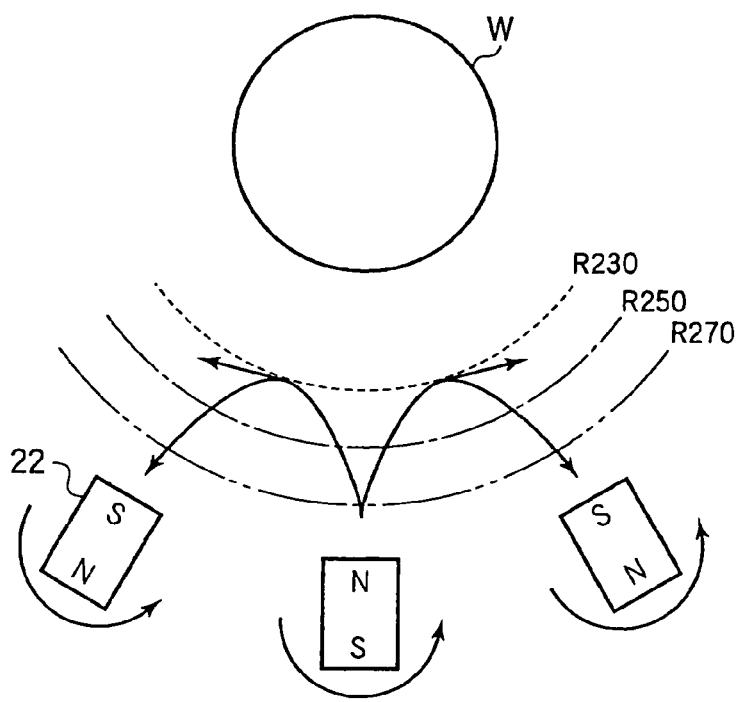
FIG. 5 is a view showing another example of revolving operation of segment magnets of the plasma etching unit of FIG. 1.
Figure 6:
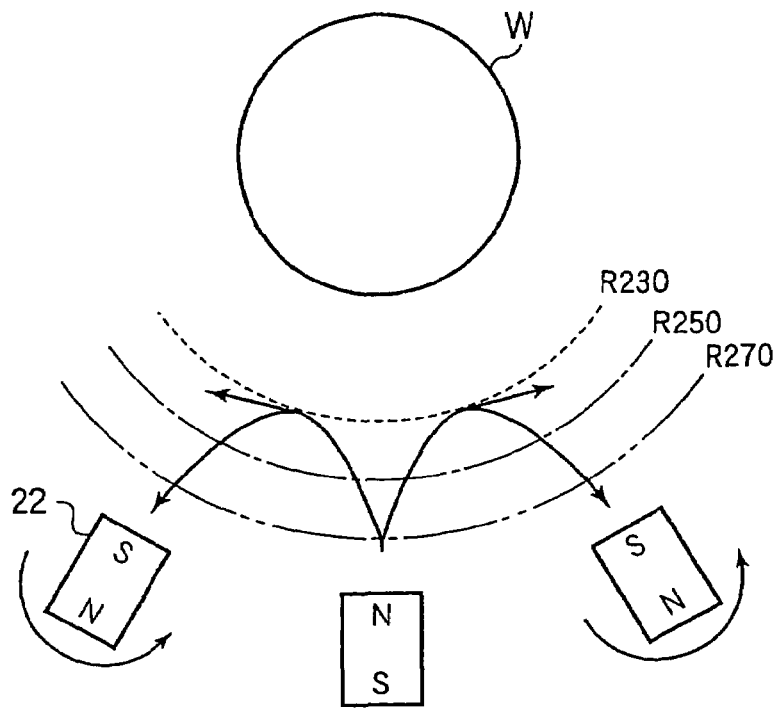
FIG. 6 is a view showing further another example of revolving operation of segment magnets of the plasma etching unit of FIG. 1.
Figure 7:
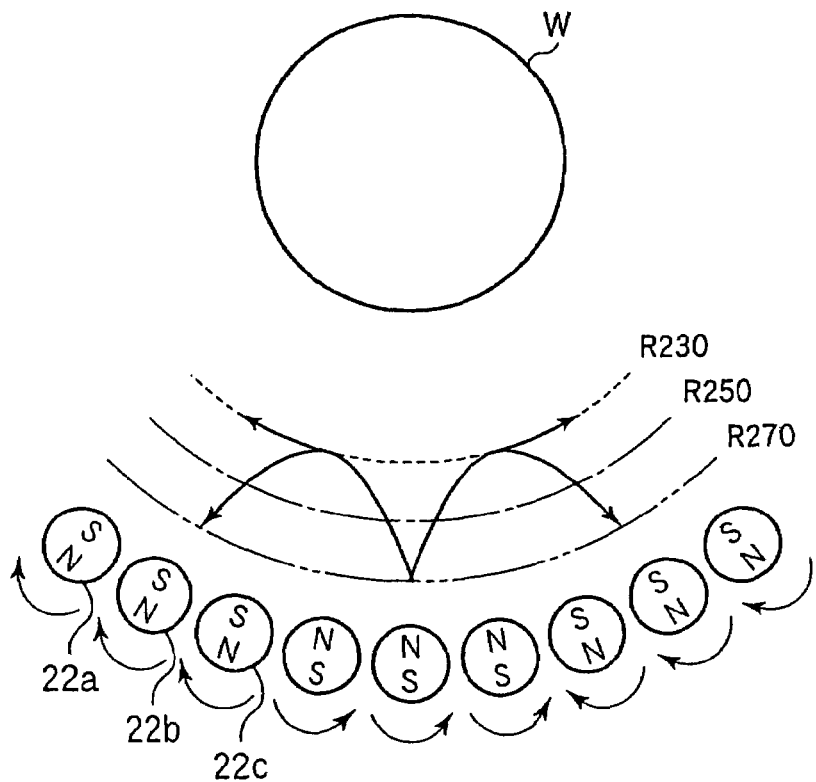
FIG. 7 is a view showing another example of segment magnets for the plasma etching unit of FIG. 1.

The revolving manner of the segment magnets 22, for switching between the state wherein the multi-pole magnetic field is formed and the state wherein the multi-pole magnetic field is not formed, is not limited to the manner shown in FIG. 3. For example, as shown in FIG. 5, all the segment magnets 22 may be configured to revolve in the same direction. Alternatively, as shown in FIG. 6, only every other segment magnet 22 may be configured to revolve while the other segment magnets 22 may be fixed. When the manner shown in FIG. 6 is adopted, the number of revolving segment magnets 22 is reduced, so that the revolving mechanism may be made simpler. In addition, as shown in FIG. 7, one magnetic pole may consist of a set of a plurality of segment magnets, for example a set of three segment magnets 22a, 22b and 22c. In the case, these segment magnets 22a, 22b and 22c may synchronously revolve in the same direction. Like this, if a larger number of segment magnets are used, the strength of the magnetic field can be enhanced more.

Next, arrangement examples of the segment magnets and magnetic fields generated thereby are explained.

FIGS. 8A to 8E are schematic views showing various arrangement examples of the segment magnets.

Figure 8A:
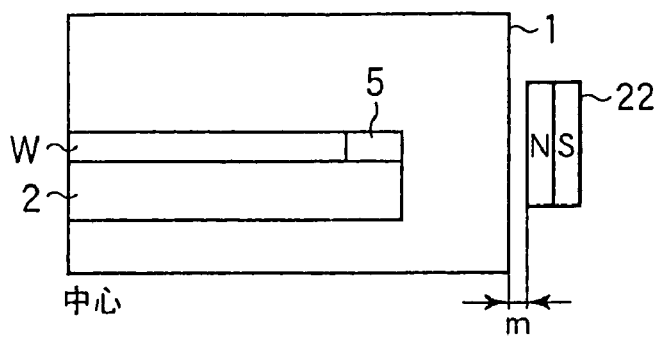
FIGS. 8A to 8E are schematic views showing various arrangement examples of the segment magnets of the plasma etching unit of FIG. 1.

FIG. 8A is a standard arrangement example. In the case, the segment magnets 22 are arranged away from a lateral wall of the chamber 1 by a predetermined distance m. A profile of magnetic field generated by this arrangement may be adjusted by changing magnetic forces and/or vertical lengths of the segment magnets 22.

Figure 8B:
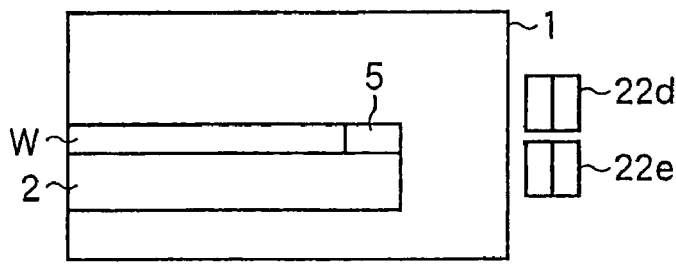
Figure 8C:
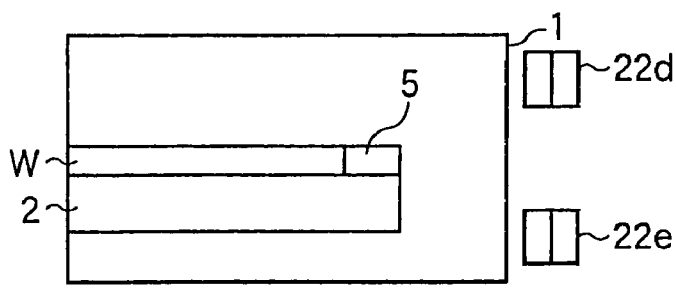

In examples shown in FIGS. 8B and 8C, each segment magnet 22 is vertically bisected into a magnet 22d and a magnet 22e. Then, a set of annularly arranged magnets 22d and a set of annularly arranged magnets 22e are respectively vertically movable. As shown in FIG. 8B, when a gap between the magnets 22d and 22e is small and a distance between the magnets and a wafer edge is short, a relatively large magnetic field is formed in a periphery of the edge of the wafer W. On the other hand, as shown in FIG. 8C, when a gap between the magnets 22d and 22e is large and a distance between the magnets and a wafer edge is long, a relatively small magnetic field is formed in a periphery of the edge of the wafer W. Herein, the divided magnets 22d and 22e may have the same magnetization direction. However, it is more preferable that they have opposite magnetization directions, because the same magnetic-pole portions (P portions shown in FIG. 2) are dispersed so that whittling of the inner-wall portion of the chamber 1 is prevented.

Figure 8D:
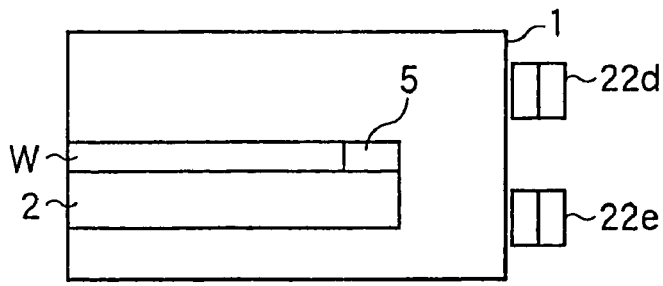
Figure 8E:
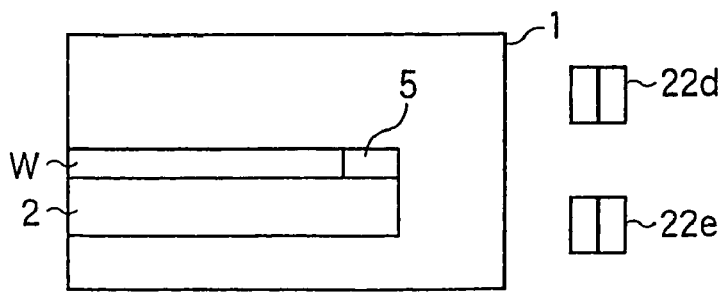

In examples shown in FIGS. 8D and 8E, a set of the divided magnets 22d and a set of the divided magnets 22e are respectively forward and backward movable. As shown in FIG. 8D, when the magnets 22d and 22e are located nearer to the lateral wall of the chamber 1 than the predetermined distance m (when the diameters of the annular magnetic units respectively formed by the magnets 22d and 22e are small), a stronger magnetic field is formed around the processing space. On the other hand, as shown in FIG. 8E, when the magnets 22d and 22e are located further than the predetermined distance m (when the diameters of the annular magnetic units are large), a weaker magnetic field is formed around the processing space.

As described above, by variously changing the arrangement of the segment magnets, various profiles of magnetic field can be formed. Thus, it is preferable to arrange the segment magnets so as to obtain a required profile of magnetic field.

The number of the segment magnets is not limited to the above examples. The section of each segment magnet is not limited to the rectangle, but may have any shape such as a circle, a square, a trapezoid or the like. A magnetic material forming the segment magnets 22 is also not limited, but may be any known magnetic material such as a rare-earth magnetic material, ferrite magnetic material, an Arnico magnetic material, or the like.

Next, an operation for etching a low-dielectric-constant film (low-k film) as an organic-material film by using the above plasma etching unit and by using an inorganic-material film as a mask is explained.

Figure 9A:
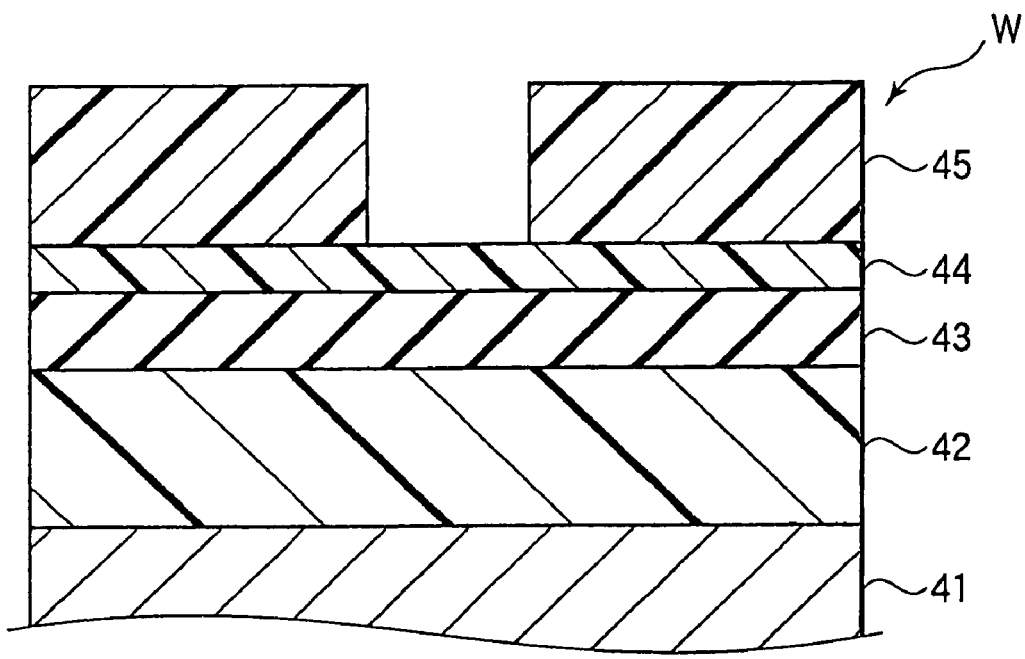
FIGS. 9A and 9B are sectional views showing a structural example of wafer to which a plasma etching process according to the present invention is applied.

In a wafer W before being etched, as shown in FIG. 9A, an organic-material film 42 that is a low-k film is formed as an interlayer dielectric film on a silicon substrate 41. Then, an inorganic-material film 43 having a predetermined pattern is formed as a hard mask on the organic-material film 42. Thereon, a BARC layer 44 is formed. Then, a resist film 45 having a predetermined pattern is formed thereon.

The inorganic-material film 43 consists of a material generally used as a hard mask. As a suitable example, it may be a silicon oxide, a silicon nitride, a silicon oxinitride, or the like. That is, it is preferable that the inorganic-material film 43 consists of at least one of the above materials.

The organic-material film 42 to be etched is a low-k film used as an interlayer dielectric film, as described above. Thus, the dielectric constant of the organic-material film 42 is much smaller than that of a silicon oxide which is a conventional material for an interlayer dielectric film. The low-k film of the organic-material consists of, for example, a polyorganosiloxane-bridge bisbenzocyclobutene resin (BCB), a polyaryleneether resin (PAE) such as SiLK (commercial name) and FLARE (commercial name) made by DowChemical Company, an organic polysiloxane resin such as methylsilsesquioxane (MSQ), or the like. Herein, the organic polysiloxane means a material having a structure wherein a functional group including C, H is included in a bonding-structure of a silicon oxide film, as shown below. In the structure shown below, R means an alkyl group such as a methyl group, an ethyl group, a propyl group or the like; or a derivative thereof; or an aryl group such as a phenyl group: or a derivative thereof.

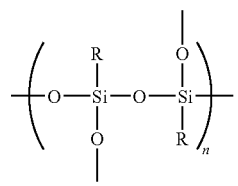

Figure 9B:
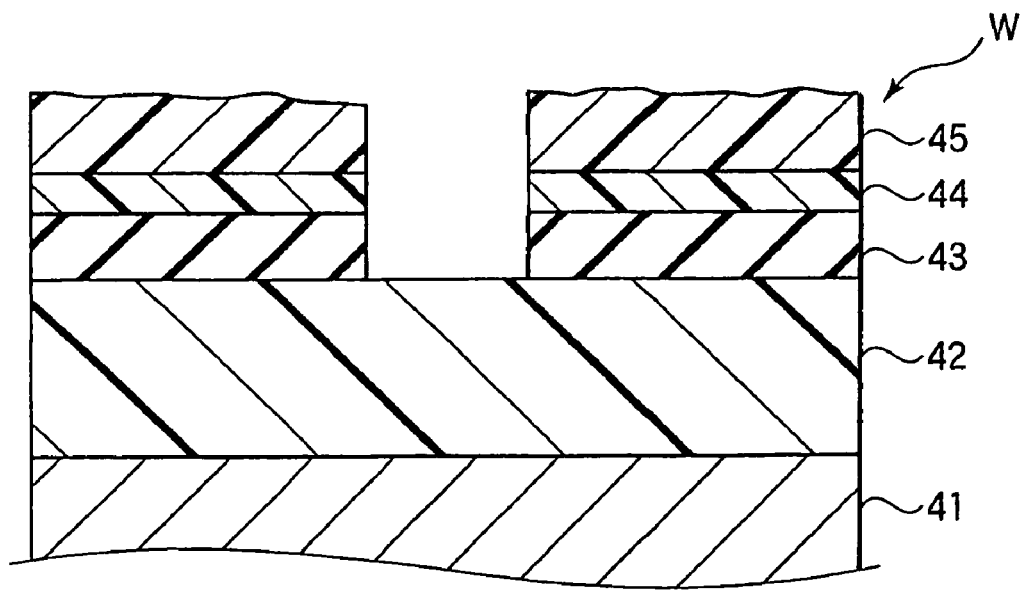

In the wafer W of the above structure, the BARC layer 44 and the inorganic-material film 43 are etched while the resist film 45 is used as a mask. The state is shown in FIG. 9B. In the step, the thickness of the resist film 45 is reduced by the etching.

Then, the organic-material film 42 is etched while the resist film 45 and the inorganic-material film 43 are used as a mask. At first, the gate valve 24 of the unit of FIG. 1 is opened, a wafer W of the structure shown in FIG. 9B is conveyed into the chamber 1 by means of a conveying arm, and placed on the supporting table 2. After that, the conveying arm is evacuated, the gate valve 24 is closed, and the supporting table 2 is moved up to a position shown in FIG. 1. The vacuum pump of the gas-discharging system 20 creates a predetermined vacuum in the chamber 1 through the discharging port 19.

Then, a predetermined process gas, for example an $N_2$ gas and an $O_2$ gas, is introduced into the chamber 1 through the process-gas supplying system 15, for example at a flow rate of 0.1 to 1 L/min (100 to 1000 sccm). Thus, a pressure in the chamber 1 is maintained at a predetermined pressure, for example about 1.33 to 133.3 Pa (10 to 1000 mTorr). Within the pressure range, in order to maintain a high etching selective ratio with respect to the inorganic-material film and to etch the organic-material film with a high etching rate, a relatively high pressure of 13.3 to 106.7 Pa (100 to 800 mTorr) is preferable. On the other hand, in order to achieve an etching process wherein an etching selective ratio with respect to the inorganic-material film is very high, residue is less, and accuracy of form is good, a relatively low pressure of 1.33 to 6.67 Pa (10 to 50 mTorr) is preferable. While the pressure in the chamber 1 is maintained within such a predetermined pressure range, a high-frequency electric power whose frequency is 50 to 150 MHz, preferably 70 to 100 MHz, is supplied from the high-frequency electric power source 10 to the supporting table 2. In this case, power per unit area (hereinafter, referred to as power density) is preferably within a range of about 1.0 to about 5.0 W/cm$^2$. In particular, a range of 2.12 to 4.25 W/cm$^2$ is preferable. Then, a predetermined electric voltage is applied from the direct current power source 13 to the electrode 6a of the electrostatic chuck 6, so that the wafer W sticks to the electrostatic chuck 6 by means of Coulomb force, for example.

When the high-frequency electric power is applied to the supporting table 2 as the lower electrode as described above, a high-frequency electric field is formed in the processing space between the showerhead 16 as the upper electrode and the supporting table 2 as the lower electrode. Thus, the process gas supplied into the processing space is made plasma, which etches the organic-material film 42. During the etching step, the resist film 45 functions as a mask partway. However, during the etching step, the resist film 45 and the BARC film 44 are etched to disappear. After that, only the inorganic-material film 43 functions as a mask, and the etching process of the organic-material film 42 is continued.

During the etching step, by means of the annular magnetic unit 21 of a multi-pole state, a magnetic field as shown in FIG. 2 can be formed around the processing space. In the case, plasma confining effect is achieved, so that an etching rate of the wafer W may be made uniform, even in a case of a high frequency like this embodiment wherein the plasma tends to be not uniform. However, depending on the kind of the film, the magnetic field may not have an effect. In the case, the segment magnets may be caused to revolve in order to conduct the etching process under a condition wherein a magnetic field is substantially not formed around the processing space.

When the above magnetic field is formed, by means of the electrically conductive or insulating focus ring 5 provided around the wafer W on the supporting table 2, the effect of making the plasma process uniform can be more enhanced. That is, if the focus ring 5 consists of an electrically conductive material such as silicon or SiC, even a focus-ring region functions as the lower electrode. Thus, a plasma-forming region is expanded over the focus ring 5, the plasma process around the wafer W is promoted, so that uniformity of the etching rate is improved. In addition, if the focus ring 5 consists of an electrically insulating material such as quartz, electric charges can not be transferred between the focus ring 5 and electrons and ions in the plasma. Thus, the plasma confining effect may be increased so that uniformity of the etching rate is improved.

Figure 10:
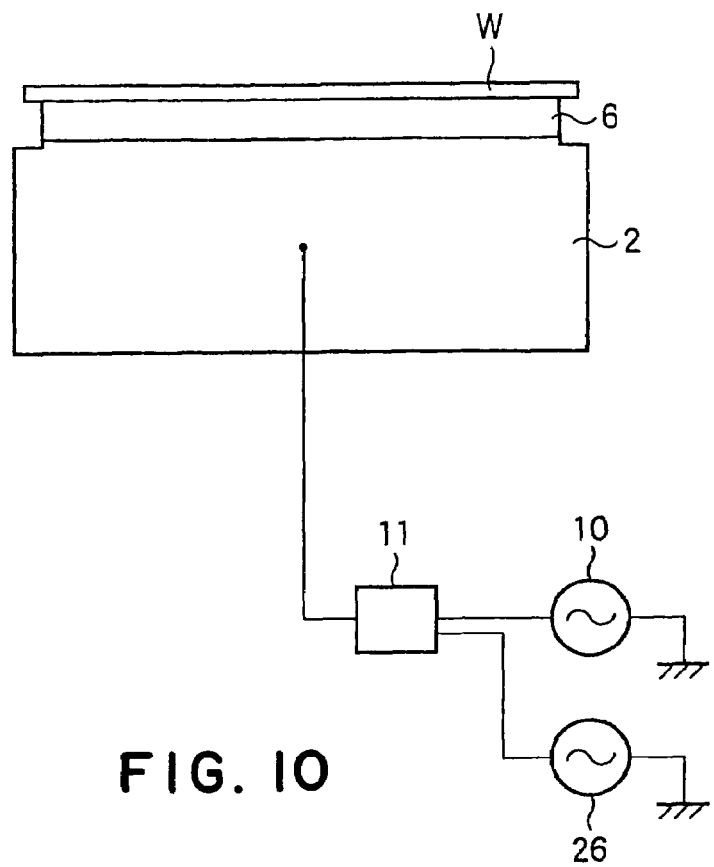
FIG. 10 is a schematic sectional view partly showing a plasma processing unit comprising a high-frequency electric power source for generating plasma and a high-frequency electric power source for drawing ions.

In order to adjust plasma density and ion-drawing effect, the high-frequency electric power for generating plasma and a second high-frequency electric power for drawing ions may be overlapped with each other. Specifically, as shown in FIG. 10, in addition to the high-frequency electric power source 10 for generating plasma, a second high-frequency electric power source 26 for drawing ions is connected to the matching box 11, so that they are overlapped. In the case, the frequency of the second high-frequency electric power source 26 for drawing ions is preferably 3.2 to 13.56 MHz, in particular 13.56 MHz. Thus, the number of parameters for controlling ion energy is increased so that an optimum processing condition can be easily set wherein an etching rate of the organic-material film is raised more while a necessary and sufficient etching selective ratio with respect to the inorganic-material film is assured.

Herein, according to a result of study by the inventors, in the etching process of the organic-material film, the plasma density is dominant, and the ion energy contributes only a little. On the other hand, in the etching process of the inorganic-material film, both the plasma density and the ion energy are necessary. Thus, when the organic-material film 42 is etched by using the inorganic-material film 43 as a mask, in order to etch the organic-material film 42 with a high etching rate and a high etching selective ratio with respect to the inorganic-material film 43, the plasma density has to be high and the ion energy has to be low. That is, if the ion energy necessary for etching the inorganic-material film is low and the plasma density dominant for etching the organic-material film is high, only the organic-material film can be selectively etched with a high etching rate. Herein, the ion energy of the plasma indirectly corresponds to a self-bias electric voltage of an electrode at the etching process. Thus, in order to etch the organic-material film with a high etching rate and a high etching selective ratio, finally, it is necessary to etch the organic-material film under a condition of high plasma density and low self-bias electric voltage.

Figure 11:
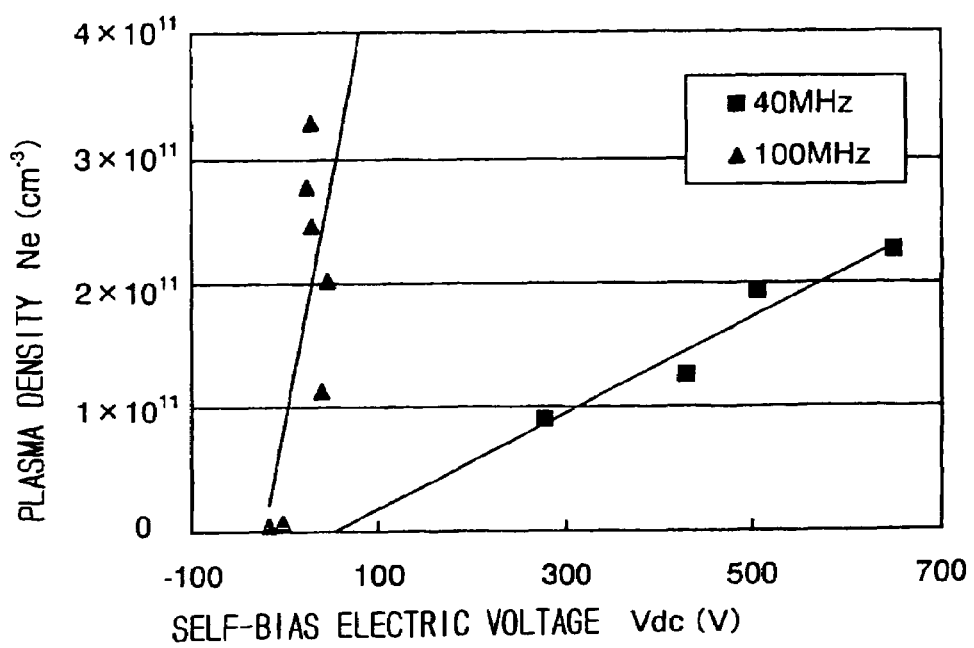
FIG. 11 is a graph showing relationships between a self-bias electric voltage Vdc and plasma density Ne, in respective cases wherein the frequency of the high-frequency electric power is 40 MHz or 100 MHz, when the plasma consists of argon gas.

This is explained with reference to FIG. 11 as follows. FIG. 11 is a graph showing relationships between a self-bias electric voltage Vdc and plasma density Ne, in respective cases wherein the frequency of the high-frequency electric power is 40 MHz or 100 MHz. The transverse axis represents the self-bias electric voltage Vdc, and the ordinate axis represents the plasma density. In the case, as the plasma gas, Ar was used for evaluation, instead of real etching gas. For each frequency, applied high-frequency electric power was changed, so that values of the plasma density Ne and the self-bias electric voltage Vdc were changed. That is, in the respective frequencies, if the applied high-frequency electric power is large, both the plasma density Ne and the self-bias electric voltage Vdc are large. Herein, the plasma density was measured by means of a microwave interferometer.

As shown in FIG. 11, in the case wherein the frequency of the high-frequency electric power is conventionally 40 MHz, when the plasma density is increased to enhance the etching rate of the organic-material film, the self-bias electric voltage Vdc is greatly increased. On the other hand, in the case wherein the frequency of the high-frequency electric power is 100 MHz that is higher than prior art, even when the plasma density is increased, the self-bias electric voltage Vdc is not so increased and controlled substantially not higher than 100 V. That is, it was found that a condition of high plasma density and low self-bias electric voltage can be achieved. That is, if the frequency is relatively low like a conventional art, when the etching rate of the organic-material film is increased in a real etching process, the inorganic-material film is also etched to the same extent and good selective-etching performance is not achieved. On the other hand, if the frequency is as high as 100 MHz, it was found that the organic-material film can be etched with a high etching rate and a high etching selective ratio with respect to the inorganic-material film.

In addition, as seen from FIG. 11, in order to etch the organic-material film with a high etching rate and a high etching selective ratio by higher plasma density and lower self-bias electric voltage than prior art, when the plasma of Ar gas is formed, it may be thought preferable to form the plasma under a condition wherein the plasma density is not less than $1 \times 10^{11}$ cm$^{-3}$ and the self-bias electric voltage of the electrode is not higher than 300 V. More preferably, the plasma density is not less than $1.5 \times 10^{11}$ cm$^{-3}$ and the self-bias electric voltage of the electrode is not higher than 100 V. Then, in order to satisfy such a plasma condition, it may be estimated that the frequency of the high-frequency electric power has to be 50 MHz or higher.

Thus, the frequency of the high-frequency electric power for generating plasma is set not less than 50 MHz, as described above. However, if the frequency of the high-frequency electric power for generating plasma is higher than 150 MHz, the uniformity of the plasma may be deteriorated. Thus, it is preferable that the frequency of the high-frequency electric power for generating plasma is not higher than 150 MHz. In particular, in order to effectively achieve the above effect, it is preferable that the frequency of the high-frequency electric power for generating plasma is 70 to 100 MHz.

Figure 12:
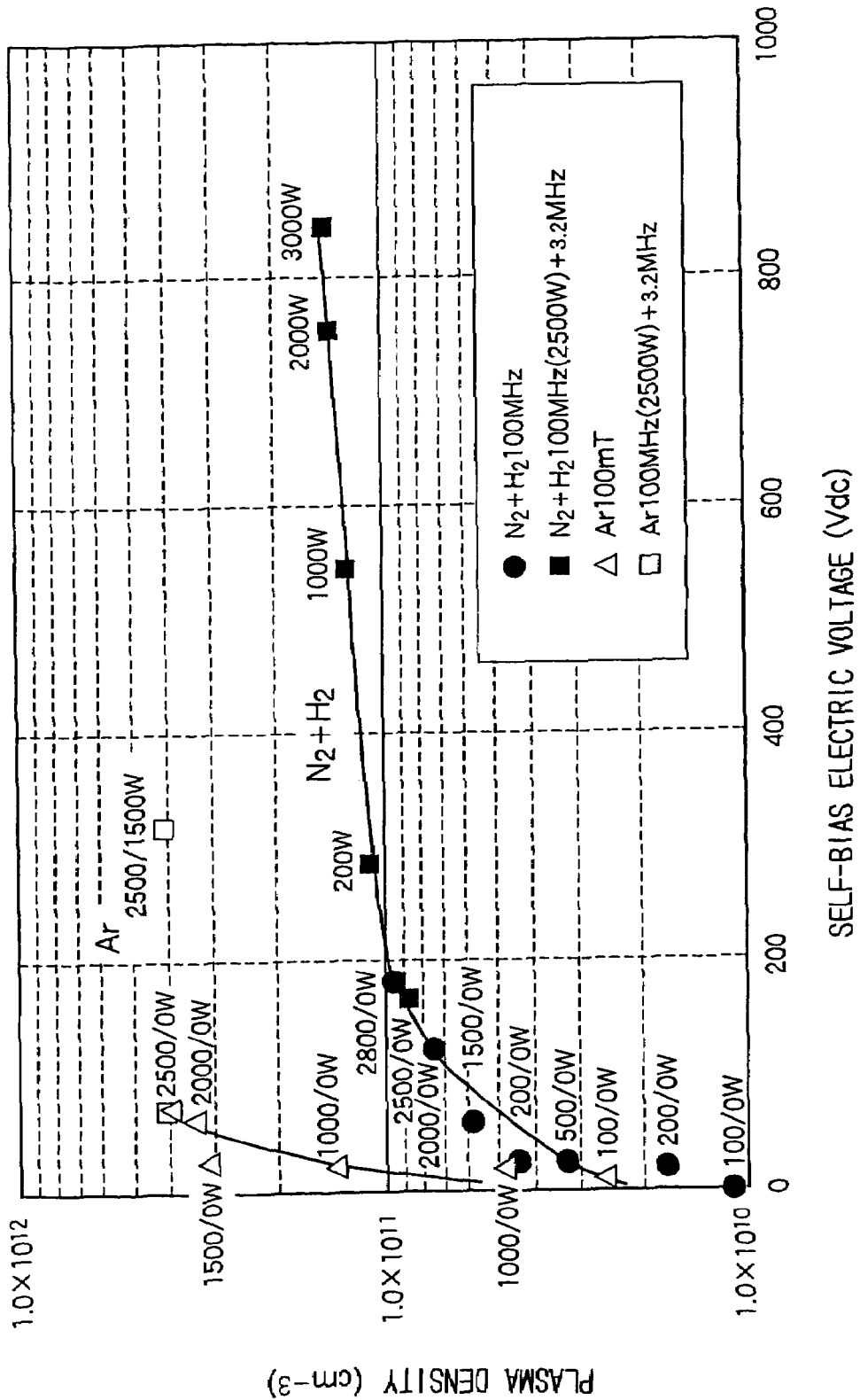
FIG. 12 is a graph comparatively showing relationships between a self-bias electric voltage and plasma density, in respective cases wherein the plasma is formed by an Ar gas or an etching gas, when the frequency of the high-frequency electric power is 100 MHz.

Next, a measurement result of self-bias electric voltage and plasma density is explained wherein a real etching gas ($N_2$+ $H_2$) is used and a high-frequency electric power of 100 MHz is applied. FIG. 12 is a graph comparatively showing relationships between a self-bias electric voltage and plasma density, in respective cases wherein the plasma is formed by an Ar gas or an etching gas, when the frequency of the high-frequency electric power is 100 MHz. The transverse axis represents the self-bias electric voltage Vdc, and the ordinate axis represents the plasma density. At that time, the pressure in the chamber was 13.3 Pa (100 mTorr). Herein, the power of the high-frequency electric power of 100 MHz was changed, so that the plasma density and the self-bias electric voltage Vdc were changed. In addition, the power of the high-frequency electric power of 100 MHz was fixed to 2500 W while a second high-frequency electric power of 3.2 MHz was overlapped in a range of 200 to 3000 W.

As shown in FIG. 12, in the case of the plasma of real etching gas, compared with the plasma of Ar gas, the plasma density tends to be a little lower. In addition, when the second high-frequency electric power of the lower frequency (3.2 MHz) is overlapped and the power is increased, the self-bias electric voltage tends to be increased.

As described above, in the case of the high frequency of 100 MHz, the plasma density tends to be higher and the self-bias electric voltage tends to be lower than the conventional art. Thus, in FIG. 12, in a condition wherein the plasma density of the etching gas at 1000 W is not less than $5\times10^{10}$ cm$^{-3}$, which corresponds to $1\times10^{11}$ cm$^{-3}$ of the Ar plasma, the etching process can be conducted with a high etching rate while satisfying an etching selective ratio with respect to the inorganic-material film.

When the second high-frequency electric power of 3.2 MHz is not overlapped, at 2800 W, the plasma density becomes $1\times10^{11}$ cm$^{-3}$ and the self-bias electric voltage becomes about 200 V. On the other hand, when the second high-frequency electric power of 3.2 MHz is overlapped and the power is increased, at 3000 W, the plasma density becomes about $1\times10^{11}$ to $2\times10^{11}$ cm$^{-3}$ and the self-bias electric voltage becomes about 800 to 900 V. When the overlapped power of 3.2 MHz is increased, it is thought that the etching rate is also increased. On the other hand, when the self-bias electric voltage is increased, the etching selective ratio with respect to the inorganic-material film tends to be lowered. However, until the self-bias electric voltage reaches about 900 V, the etching selective ratio can be maintained in an allowable range. Thus, when the overlapped power (bias power) of the second high-frequency electric power is increased, the etching rate may be enhanced while an etching selective ratio of a desirable level is maintained. That is, under a condition wherein the plasma density is $5\times10^{10}$ to $2\times10^{11}$ cm$^{-3}$ and the self-bias electric voltage of the electrode is not higher than 900 V, it is possible that the etching process is conducted with a high etching rate while maintaining the etching selective ratio with respect to the inorganic-material film within a desirable range.

Next, specific preferable conditions are explained.

At first, they includes a condition wherein: a pressure in the chamber 1 is 13.3 to 106.7 pa (100 to 800 mTorr) that is high; a first high-frequency electric power having a frequency of 50 to 150 MHz, for example 100 MHz, and a power density of 2.12 to 4.25 W/cm$^2$ is applied to the supporting table 2; if necessary, a second high-frequency electric power having a frequency of 500 kHz to 27 MHz, for example 3.2 MHz, and a power density of not higher than 4.25 W/cm$^2$ is applied to be overlapped with the first high-frequency electric power; the plasma density is $5\times10^{10}$ to $2\times10^{11}$ cm$^{-3}$; and the self-bias electric voltage Vdc of the supporting table 2 as the lower electrode is not higher than 900 V. Under the condition, since the pressure in the chamber 1 is relatively high, vertical component of ion energy can be relatively reduced. In addition, the bias power is adjusted so that the organic-material film can be etched with a high etching selective ratio with respect to the inorganic-material film and with a high etching rate. In particular, when a hole is etched, a very high etching rate can be achieved while a high etching selective ratio can be maintained.

In addition, they includes a condition wherein: a pressure in the chamber 1 is 1.33 to 6.67 pa (10 to 50 mTorr) that is low; a first high-frequency electric power having a frequency of 50 to 150 MHz, for example 100 MHz, and a power density of 2.12 to 4.25 W/cm$^2$ is applied to the supporting table 2; if necessary, a second high-frequency electric power having a frequency of 500 kHz to 27 MHz, for example 3.2 MHz, and a power density of not higher than 0.566 W/cm$^2$ is applied to be overlapped with the first high-frequency electric power; the plasma density is $5\times10^{10}$ to $2\times10^{11}$ cm$^{-3}$; and the self-bias electric voltage Vdc of the supporting table 2 as the lower electrode is not higher than 400 V. Under the condition, since the pressure in the chamber 1 is low, ion energy itself can be controlled not higher than energy by which the inorganic-material film can be spattered. In addition, through adjustment of the bias power or the like, the self-bias electric voltage is limited within the relatively low range. Thus, the organic-material film can be etched with a high etching rate and a very high etching selective ratio with respect to the inorganic-material film. In addition, surface residue is substantially not left. In addition, a CD-shift of the mask of the inorganic-material film can be remarkably reduced.

Next, in order to obtain a real etching rate of an organic-material film and an etching selective ratio with respect to an inorganic-material film, etching experiments for whole-surface formed films of an organic-material film (resist) and an inorganic-material film (SiO$_2$) were conducted. The result is explained. Herein, a 200 mm wafer is used as the wafer W, an N$_2$ gas: 0.1 L/min and an O$_2$ gas: 0.01 L/min were supplied as an etching gas, the gap between the electrodes was 27 mm, and the pressure in the chamber was 2.66 Pa.

Figure 16:
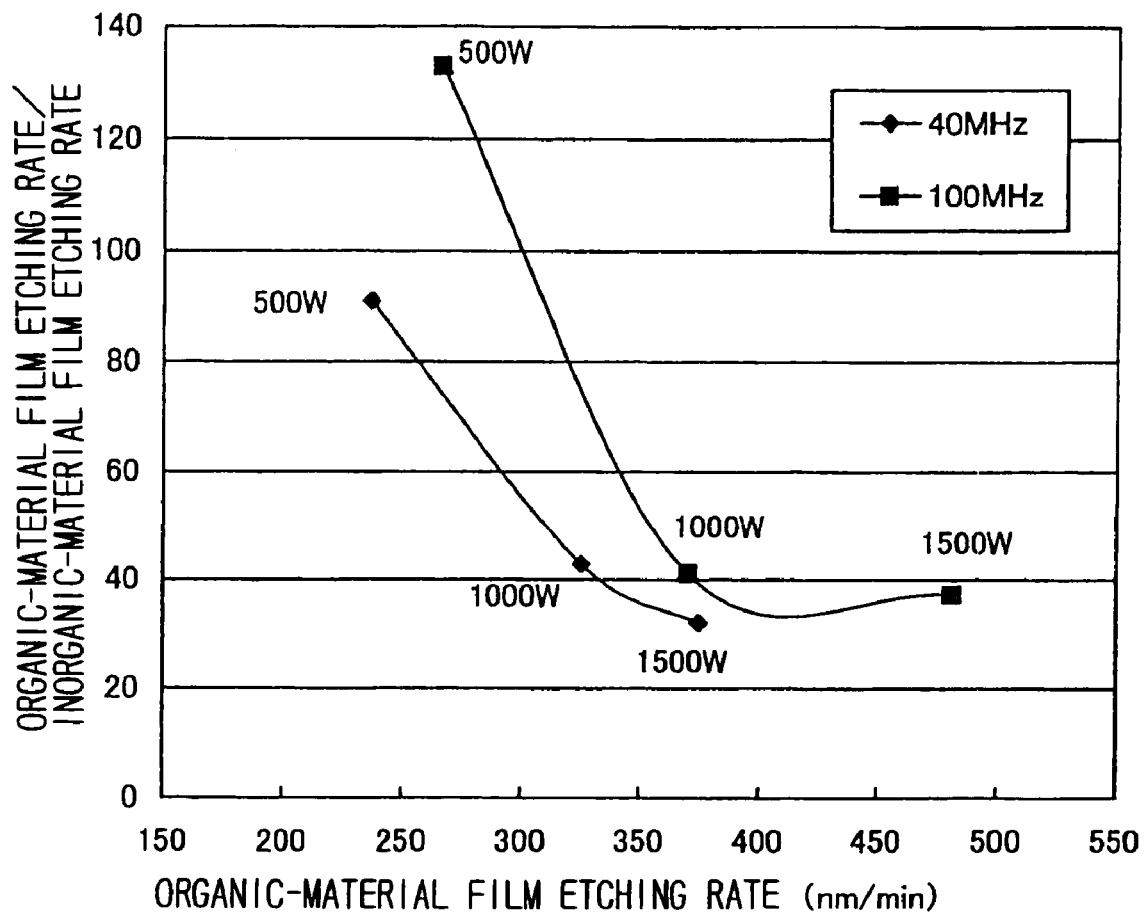
FIG. 16 is a graph showing relationships between an etching rate of the organic-material film and a ratio (an etching rate of the organic-material film/an etching rate of the inorganic-material film) corresponding to an etching selective ratio, in samples of respective cases wherein the frequency of the high-frequency electric power is 40 MHz or 100 MHz.

FIG. 13A is a graph showing etching rates of an organic-material film at a wafer position, in respective cases wherein the high-frequency electric power is 500 W (1.59 W/cm$^2$), 1000 W (3.18 W/cm$^2$) or 1500 W (4.77 W/cm$^2$), when the frequency of the high-frequency electric power is 100 MHz. FIG. 13B is a graph showing etching rates of an organic-material film at a wafer position, in respective cases wherein the high-frequency electric power is 500 W (1.59 W/cm$^2$), 1000 W (3.18 W/cm$^2$) or 1500 W (4.77 W/m$^2$), when the frequency of the high-frequency electric power is 40 MHz. FIG. 14 is a graph showing relationships between a high-frequency electric power and an etching rate of the organic-material film, in respective cases wherein the frequency of the high-frequency electric power is 40 MHz or 100 MHz. FIG. 15 is a graph showing relationships between a high-frequency electric power and an etching rate of the inorganic-material film, in respective cases wherein the frequency of the high-frequency electric power is 40 MHz or 100 MHz. FIG. 16 is a graph showing relationships between an etching rate of the organic-material film and a ratio (an etching rate of the organic-material film/an etching rate of the inorganic-material film) corresponding to an etching selective ratio, in respective cases wherein the frequency of the high-frequency electric power is 40 MHz or 100 MHz.

From these drawings, it can be seen that the etching rate of the organic-material film is higher in the case of 100 MHz, for every power. When the high-frequency electric power is increased, the etching rate of the inorganic-material film tends to be increased. However, the difference between the etching rate in the case of 40 MHz and the etching rate in the case of 100 MHz is not large. In addition, when the high-frequency electric power is higher, the etching rate of the organic-material film is higher, and when the high-frequency electric power is lower, the value corresponding to the etching selective ratio with respect to the inorganic-material film tends to be higher. In addition, comparing the etching rate in the case of 40 MHz and the etching rate in the case of 100 MHz, when the value corresponding to the etching selective ratio is the same, the etching rate in the case of 100 MHz is higher. Comparing them at the same etching rate, the value corresponding to the etching selective ratio in the case of 100 MHz is larger than the value corresponding to the etching selective ratio in the case of 40 MHz. That is, from the experimental result of the samples for estimation, it was confirmed that the possibility of etching the organic-material film with a high etching rate and a high etching selective ratio is higher in the case of 100 MHz than in the case of 40 MHz. The power of the high-frequency electric power of 100 MHz is preferably in a range of about 1.0 W/cm$^2$ to about 5.0 W/cm$^2$, because the etching rate and the etching selective ratio of the organic-material film are in a tradeoff relationship.

Next, regarding the wafer W having the structure (real pattern) shown in FIG. 9A, while the resist film 45 and the inorganic-material film 43 consisting of $SiO_2$ were used as a mask, the organic-material film 42 consisting of a low-k film was etched by the unit shown in FIG. 1 by using the high-frequency electric power of 40 MHz and 100 MHz, respectively. The etching condition of this case was the same as that in the above etching experiment of the whole-surface formed films. Herein, as the organic-material film 42, SiLK (commercial name) being a low-k film and made by DowChemical company was used. A thickness thereof was 570 nm, a thickness of the $SiO_2$ film 43 thereon was 200 nm, a thickness of the BARC film 44 thereon was 60 nm, and a thickness of the resist film 45 was 800 nm. The etching process was continued for a time that is 1.5 times as long as that until the organic-material film 42 is completely etched (50% over etching). The time for which the $SiO_2$ film is exposed to the plasma was lengthened. That is, the condition was severe on the $SiO_2$ film.

The result is shown in FIGS. 17 and 18. FIG. 17 is a graph showing relationships between a high-frequency electric power and an etching rate of the organic-material film and relationships between a high-frequency electric power and a shoulder loss of the inorganic-material film. FIG. 18 is a graph showing relationships between an etching rate of the organic-material film and an etching selective ratio with respect to an etching rate of a shoulder part of the inorganic-material film, in respective cases wherein the frequency of the high-frequency electric power is 40 MHz or 100 MHz. Herein, the shoulder loss means an etched volume of the shoulder part. Specifically, as shown in FIG. 19, the shoulder loss means a height distance (shown by Y in the drawing) from the original surface of the inorganic-material film 43 to an etched (deepest) position of the shoulder part. In addition, the etching selective ratio at the shoulder part in FIG. 18 means a ratio of the etching rate of the organic-material film with respect to the etching rate at the shoulder part of the inorganic-material film 43 calculated from the value of the shoulder loss.

As shown in FIG. 17, in the respective high-frequency electric powers, when the respective results in the cases of 100 MHz and 40 MHz are compared with each other, the shoulder loss is at the same level, but the etching rate of the organic-material film is higher in the case of 100 MHz. In addition, as shown in FIG. 18, in the real pattern, in the same manner as FIG. 16 showing the results of the samples for estimation, when the etching selective ratio is the same, the etching rate of the organic-material film is higher in the case of 100 MHz. When the etching rate is the same, the etching selective ratio tends to be higher in the case of 100 MHz. That is, in the etching process of the real pattern, it was confirmed that the organic-material film can be etched with a high etching rate and a high etching selective ratio when the high-frequency electric power of 100 MHz, other than 40 MHz, is used.

In the above experiment, the gap between the electrodes was 27 mm. As described above, if the distance between the electrodes is too small, pressure distribution (pressure difference between at a central portion and at a peripheral portion) on the surface of the wafer W, which is a substrate to be processed, becomes so large that deterioration of the etching uniformity or the like may be generated. Thus, in practice, the distance between the electrodes is preferably 35 to 50 mm. This is explained with reference to FIG. 20.

FIG. 20 is a graph comparatively showing relationships between an Ar-gas flow rate and a pressure difference ΔP of a central portion of the wafer and a peripheral portion thereof, in respective cases wherein the electrode gap is 25 mm or 40 mm, wherein the Ar gas is used as a plasma gas. As shown in FIG. 20, the pressure difference ΔP is smaller when the gap is 40 mm rather than 25 mm. In addition, in the case of the gap of 25 mm, when the Ar-gas flow rate is increased, the pressure difference ΔP tends to be sharply increased. When the gas flow rate is higher than about 0.3 L/min, it exceeds 0.27 Pa (2 mTorr) as an allowable maximum pressure difference ΔP, at which deterioration of the etching uniformity or the like may not be generated. On the other hand, in the case of the gap of 40 mm, independently on the gas flow rate, the pressure difference is smaller than 0.27 Pa (2 mTorr). Thus, it can be expected that the allowable maximum pressure difference ΔP at which deterioration of the etching uniformity or the like may not be generated is ensured, independently on the gas flow rate, if the electrode gap is not less than about 35 mm.

Next, regarding a 300 mm wafer having the real pattern shown in FIG. 9A, respective films having the same thicknesses as the example shown in FIGS. 17 and 18, while the resist film 45 and the inorganic-material film 43 consisting of $SiO_2$ were used as a mask, the organic-material film 42 consisting of a low-k film was etched. Herein, according to the manner shown in FIG. 10, two high-frequency electric power sources of 100 MHz and 3.2 MHz were connected to the supporting table 2, the high-frequency electric power of 100 MHz was fixed to 2400 W, and the second high-frequency electric power of 3.2 MHz was changed between 0 W, 200 W, 800 W, 1600 W and 3000 W. As the process gas, an $N_2$ gas and an $H_2$ gas were used. The pressure in the chamber was changed between 13.3 Pa (100 mTorr), 31.7 Pa (450 mTorr) and 106.7 Pa (800 mTorr). The flow rate of the process gas was the $N_2$ gas: 0.5 L/min and the $H_2$ gas: 0.5 L/min in the case of 13.3 Pa, and the $N_2$ gas: 0.65 L/min and the $H_2$ gas: 0.65 L/min in the cases of 31.7 Pa and 106.7 Pa. The electrode gap was 40 mm. The etching process was conducted as 50% over etching in the same manner as the above example.

Figure 21:
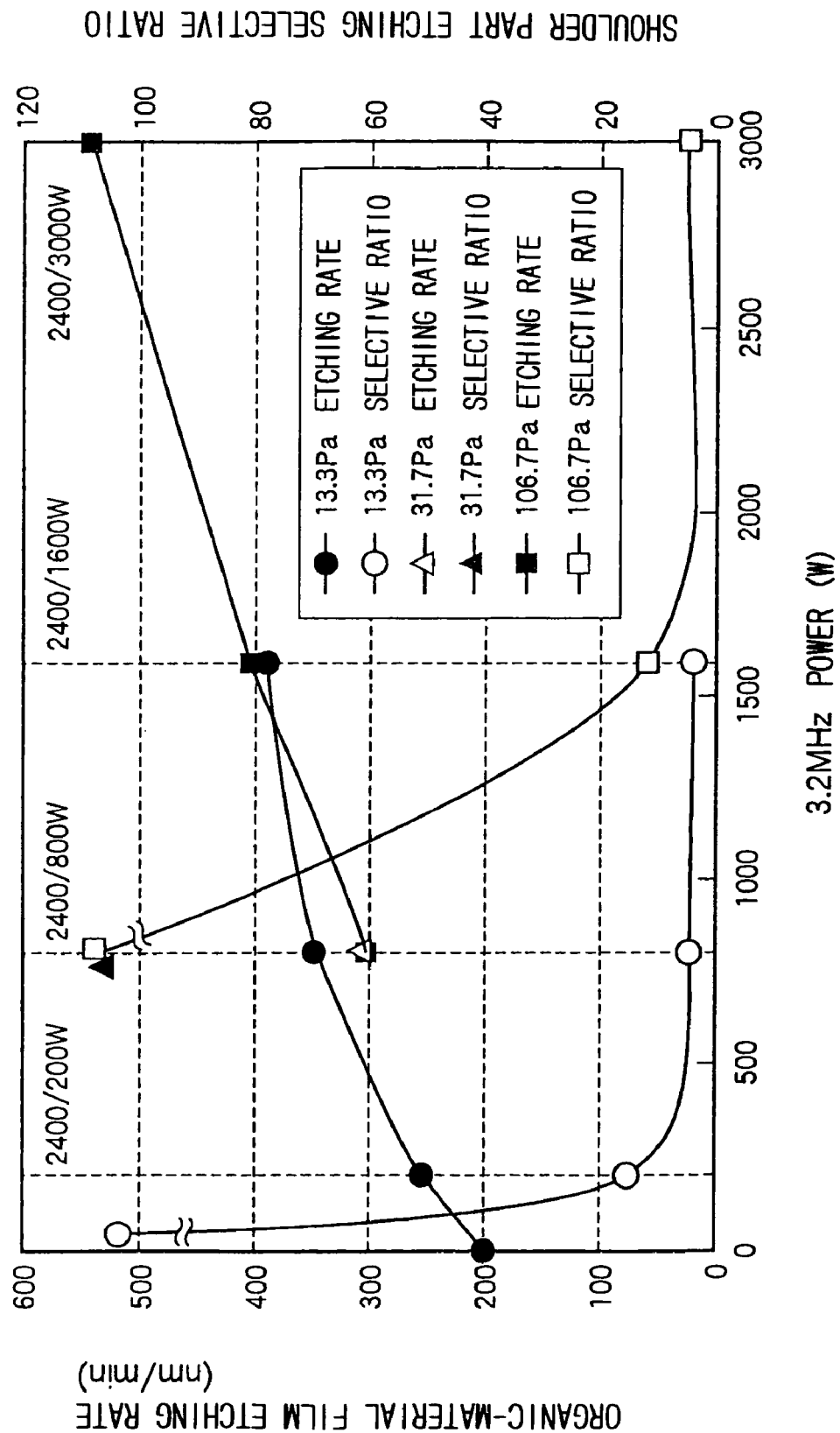
FIG. 21 is a graph showing relationships between the electric power of 3.2 MHz and an etching rate of the organic-material film and relationships between the electric power of 3.2 MHz and an etching selective ratio with respect to the shoulder part, in respective pressure conditions.
Figure 22:
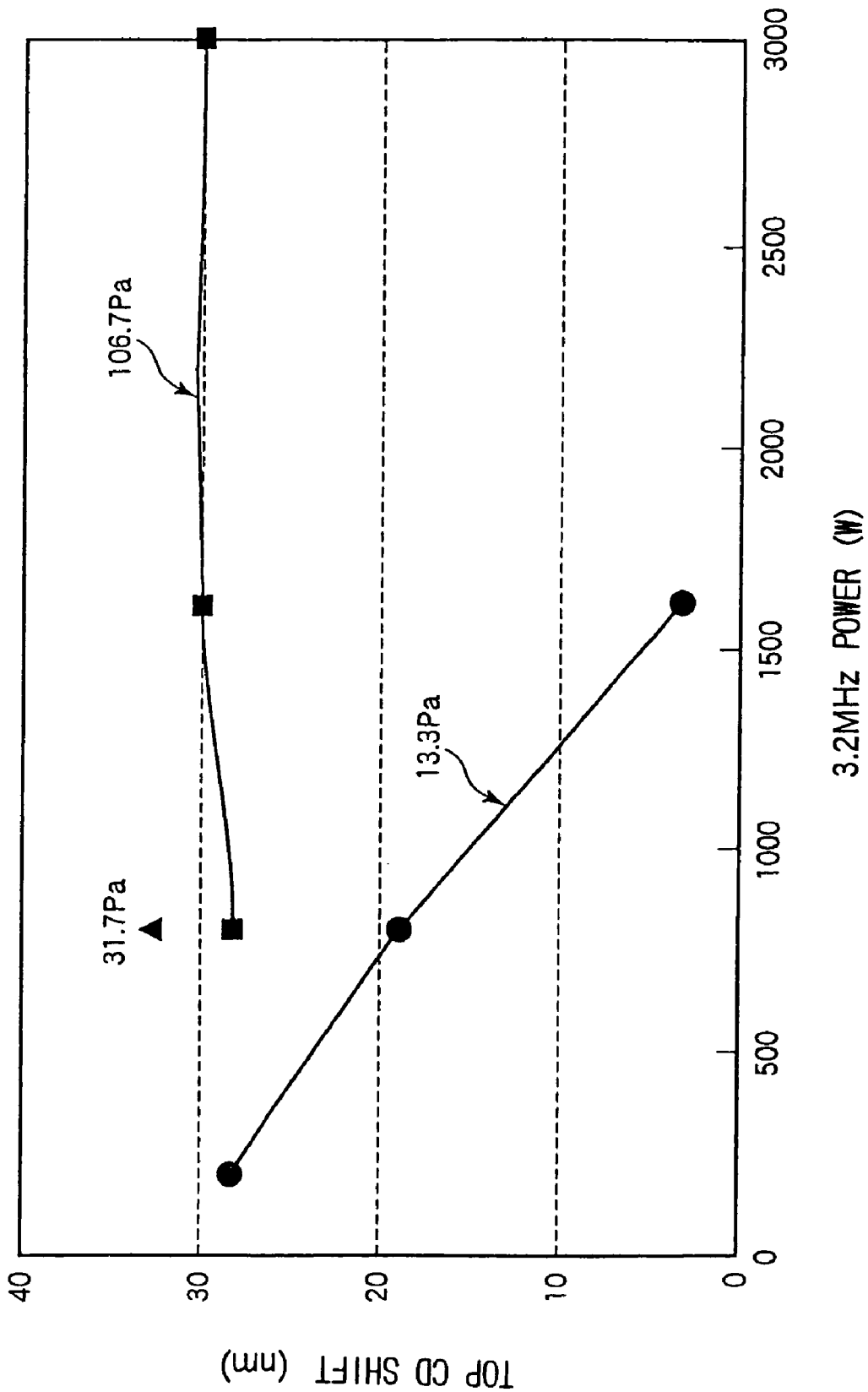
FIG. 22 is a graph showing relationships between the electric power of 3.2 MHz and a top CD shift, in respective pressure conditions.
Figure 23:
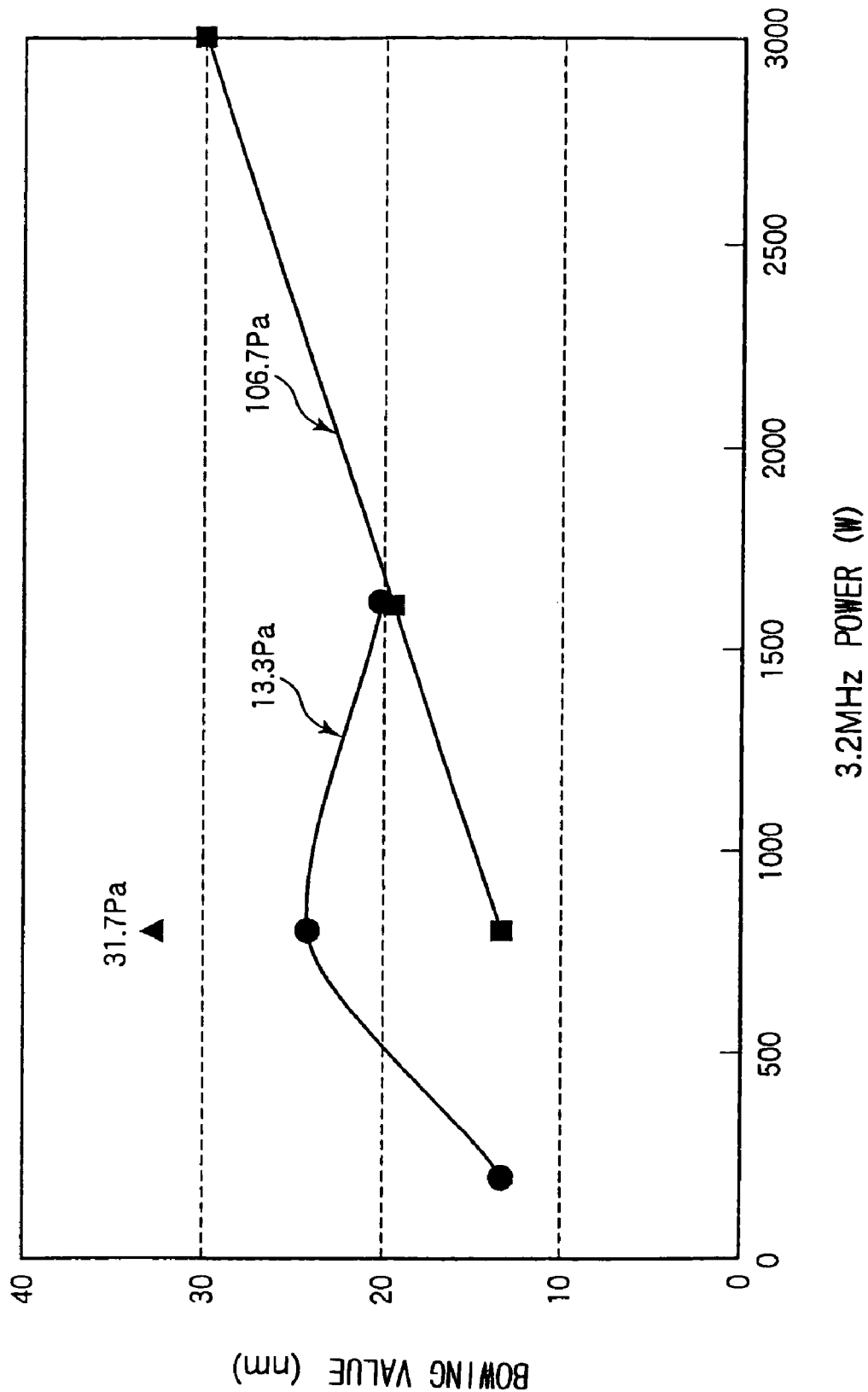
FIG. 23 is a graph showing relationships between the electric power of 3.2 MHz and a bowing value, in respective pressure conditions.
Figure 24:
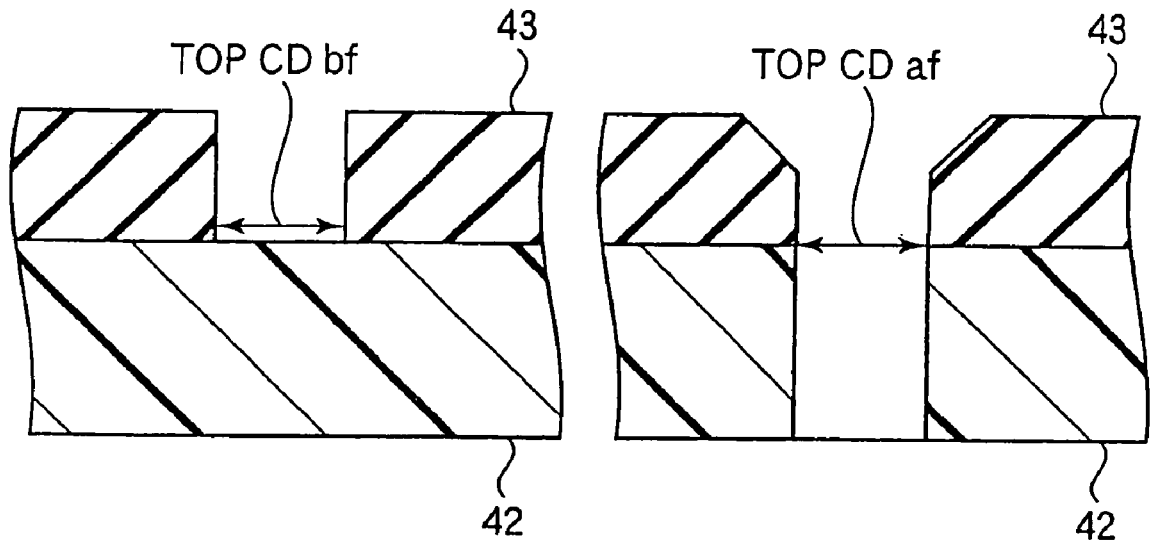
FIG. 24 is a view for explaining a top CD shift.
Figure 25:
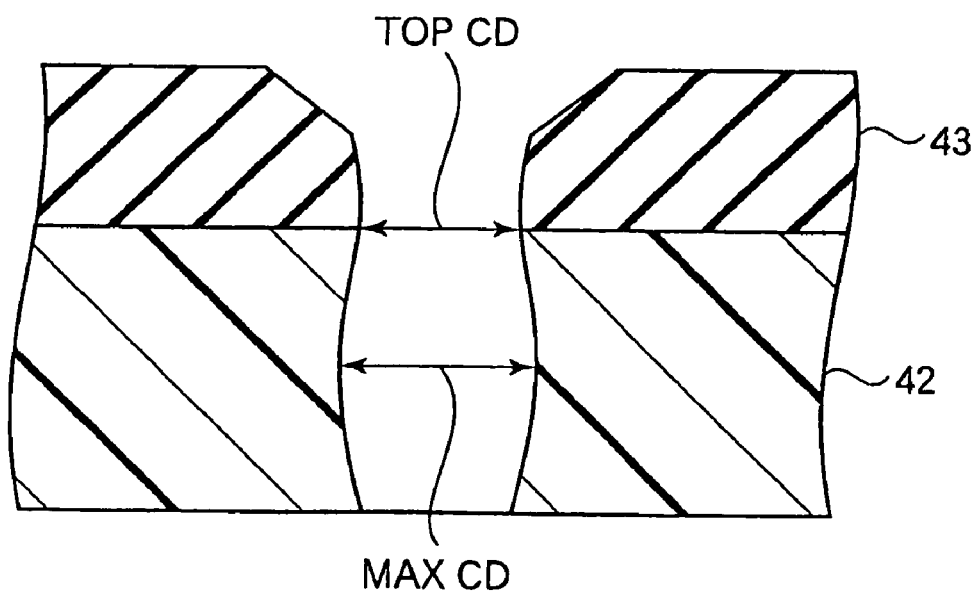
FIG. 25 is a view for explaining a bowing value.

The result is shown in FIGS. 21 to 23. FIG. 21 is a graph showing relationships between the power of the second high-frequency electric power of 3.2 MHz and an etching rate of the organic-material film and relationships between the power of the second high-frequency electric power of 3.2 MHz and an etching selective ratio with respect to the shoulder part, in respective pressure conditions. FIG. 22 is a graph showing relationships between the power of the second high-frequency electric power of 3.2 MHz and a top CD shift, in respective pressure conditions. FIG. 23 is a graph showing relationships between the power of the second high-frequency electric power of 3.2 MHz and a bowing value, in respective pressure conditions. Herein, as shown in FIG. 24, the top CD shift means a value showing how much a top CD is changed through the etching process, the top CD meaning an etching opening at an upper-end portion of the organic-material film 42. That is, the top CD shift means a value obtained by subtracting an original top CD (TopCDbf) from a top CD after the etching process (TopCDaf). In addition, the bowing value means a value obtained by subtracting the top CD (TopCD) from a maximum width (MaxCD) at an etched portion after the etching process of the organic-material film.

In the example, since the pressure in the chamber is 13.3 Pa or higher, ion dispersion is great, so that vertical component of ion energy is relatively reduced. Thus, as shown in FIG. 21, when the power of the second high-frequency electric power (bias power) of 3.2 MHz is relatively low, the inorganic-material mask is hardly etched. That is, the organic-material film can be etched with a high etching selective ratio with respect to the inorganic-material mask. Furthermore, in the case, the etching rate of the organic-material film is also high. In addition, at the same bias power, the etching selective ratio tends to be higher under a condition of a higher pressure wherein the vertical component of ion energy is less. In addition, in each pressure, when the power of the second high-frequency electric power of 3.2 MHz is increased, the etching rate of the organic-material film is increased while the etching selective ratio at the shoulder portion tends to be lowered. If the power of the second high-frequency electric power of 3.2 MHz is low, an ion-drawing force to the wafer is weak so that ions are supplied to the inorganic-material mask only very softly. Thus, the inorganic-material mask is hardly etched, so that a high etching selective ratio can be obtained. On the other hand, when the power of the second high-frequency electric power of 3.2 MHz is increased, the ion-drawing force to the wafer becomes stronger, so that the etching rate of the organic-material film is increased but the etching rate of the inorganic-material film is also increased. Thus, the etching selective ratio is deteriorated. In the case of the pressure of 13.3 Pa, when the bias power is 1600 W (power density: 2.26 W/cm$^2$) that is high, the etching rate of the organic-material film is 400 nm/min that is high, but the etching selective ratio is reduced to about 3 or 4. This feature is usable for some applications. However, it can be expected that a bias power higher than the above is not usable because the etching loss of the inorganic-material mask is too much. In the case of the pressure of 106.7 Pa, even when the bias power is 3000 W (power density: 4.25 W/cm$^2$), the etching selective ratio is maintained at about 5. This feature is usable for some applications. Then, the etching rate of the organic-material film is 550 nm/min, which is very high. However, even in the case of the pressure of 106.7 Pa, it is expected that a bias power higher than 3000 W (power density: 4.25 W/cm$^2$) is not usable because the etching loss of the inorganic-material mask is too much.

As shown in FIG. 22, the top CD shift tends to be better in the case of the pressure of 13.3 Pa than in the case of the pressure of 106.7 Pa. Furthermore, in the case of 13.3 Pa, when the bias power is increased, the top CD shift is reduced, and when the bias power is 1600 W (power density: 2.26 W/cm$^2$), the top CD shift is about 2 to 3 nm. In the case of the pressure of 106.7 Pa, independently on the bias power, the top CD shift is 30 nm. In the case of the pressure of 106.7 Pa, the top CD shift is near to the upper limit of an allowable range. Thus, the substantially upper limit of the pressure in the chamber is 106.7 Pa.

As shown in FIG. 23, the bowing value tends to be lower in the case of the pressure of 106.7 Pa than in the case of the pressure of 13.3 Pa, at the same bias power. In addition, in the case of 106.7 Pa, when the bias power is increased, the bowing value is increased, and when the bias power is 3000 W (power density: 4.25 W/cm$^2$), the bowing value is 30 nm. When the bias power is higher than 3000 W, it is expected that the bowing value exceeds 30 nm. Thus, the upper limit of the bias power is 3000 W (power density: 4.25 W/cm$^2$).

Next, regarding a 300 mm wafer having the real pattern shown in FIG. 9A, respective films having the same thicknesses as the example shown in FIGS. 17 and 18, while the resist film 45 and the inorganic-material film 43 consisting of SiO$_2$ were used as a mask, the organic-material film 42 consisting of a low-k film was etched. Herein, according to the manner shown in FIG. 10, two high-frequency electric power sources of 100 MHz and 3.2 MHz were connected to the supporting table 2, the high-frequency electric power of 100 MHz was fixed to 2400 W, and the second high-frequency electric power of 3.2 MHz was changed between 0 W, 200 W and 400 W. As the process gas, an N$_2$ gas and an H$_2$ gas were used. The pressure in the chamber was changed between 1.33 Pa (10 mTorr), 3.99 Pa (30 mTorr), 6.65 Pa (50 mTorr) and 13.3 Pa (100 mTorr). The flow rate of the process gas was the N$_2$ gas: 0.12 L/min and the H$_2$ gas: 0.12 L/min in the case of 1.33 Pa, the N$_2$ gas: 0.18 L/min and the H$_2$ gas: 0.18 L/min in the cases of 3.99 Pa, the N$_2$ gas: 0.3 L/min and the H$_2$ gas: 0.3 L/min in the cases of 6.65 Pa and the N$_2$ gas: 0.5 L/min and the H$_2$ gas: 0.5 L/min in the cases of 13.3 Pa. The electrode gap was 40 mm. The etching process was conducted as 50% over etching in the same manner as the above examples.

Figure 26:
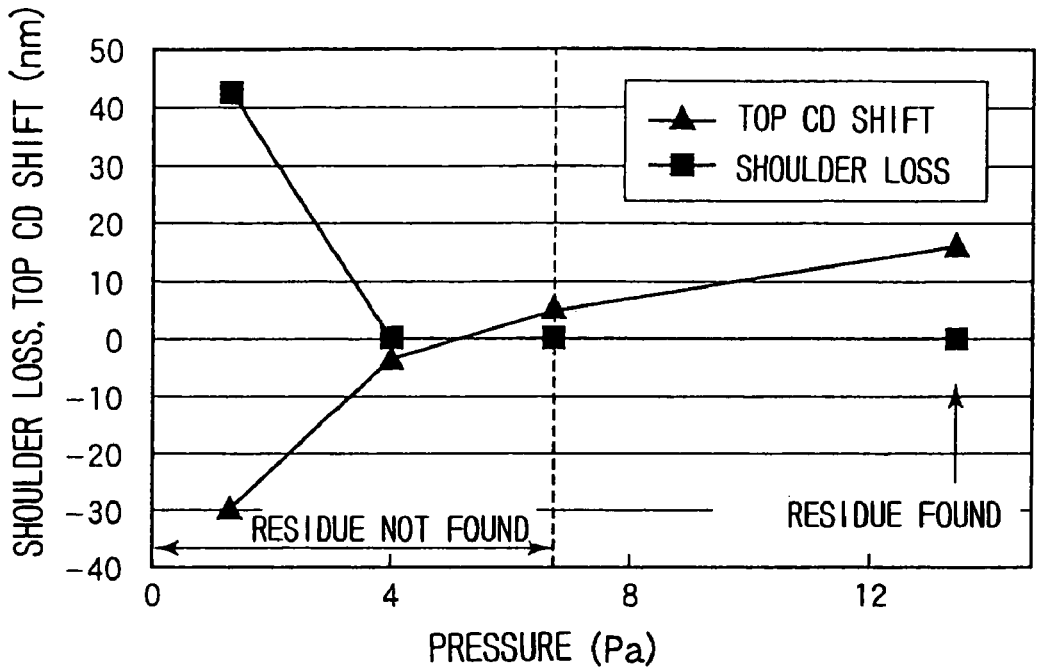
FIG. 26 is a graph showing etching residues, shoulder losses of the inorganic-material film (mask) and top CD shifts, in respective pressure conditions, when the bias power is zero.
Figure 27:
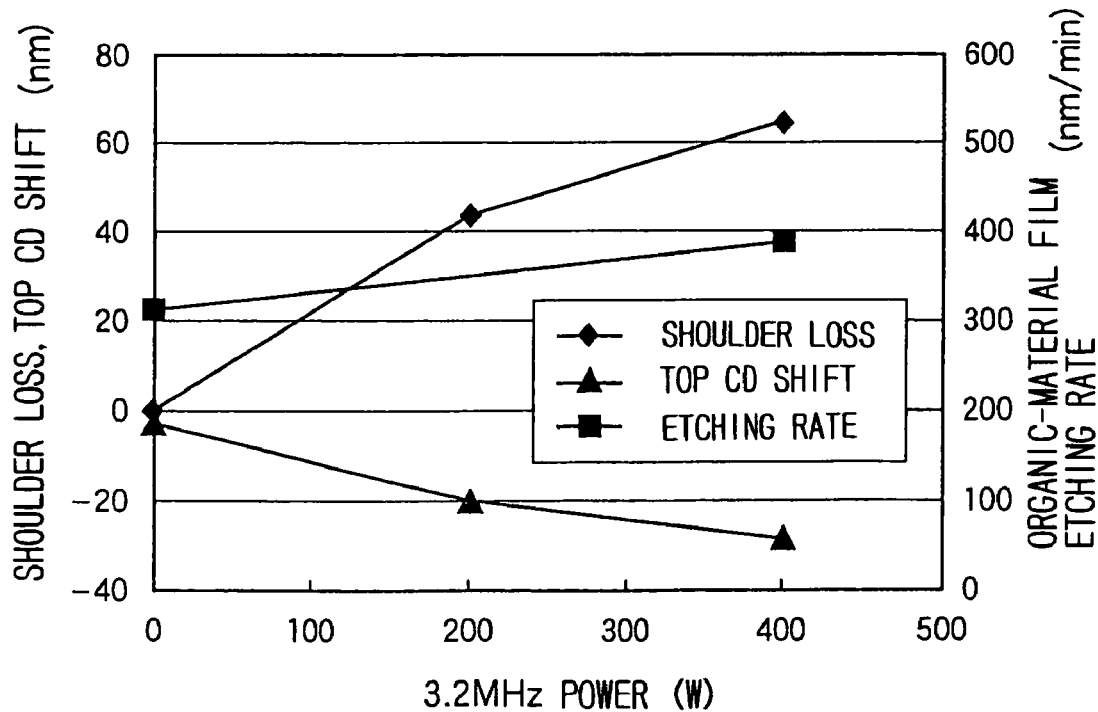
FIG. 27 is a graph showing shoulder losses of the inorganic-material film (mask), top CD shifts and etching rates of the organic-material film, in respective bias-power conditions, when the pressure is 3.99 Pa.

For each sample after the etching process, an etching residue, a shoulder loss of the inorganic-material film (mask) and a top CD shift were obtained. The result is shown in FIGS. 26 and 27. FIG. 26 is a graph showing etching residues, shoulder losses of the inorganic-material film (mask) and top CD shifts, in respective pressure conditions, when the bias power (of the second high-frequency electric power source) is zero. FIG. 27 is a graph showing shoulder losses of the inorganic-material film (mask), top CD shifts and etching rates of the organic-material film, in respective bias-power conditions, when the pressure is 3.99 Pa.

As shown in FIG. 26, no etching reside was generated when the pressure was 6.65 Pa or lower, but some etching reside was generated when the pressure was 13.3 Pa. The shoulder loss of the inorganic-material film was 0 in the cases of 3.99 Pa, 6.65 Pa and 13.3 Pa. The shoulder loss of the inorganic-material film was 42 nm in the case of 1.33 Pa, which value is relatively large but within an allowable range. The top CD shift was −3 nm in the case of 3.99 Pa, and +5 nm in the case of 6.65 Pa, which values are very small. In addition, it was confirmed that the absolute value of the top CD shift is increased both when the pressure is higher than 6.65 Pa and when the pressure is lower than 3.99 Pa. The top CD shift was −30 nm in the case of 1.33 Pa, which value is approximately within an allowable range. From these results, it was confirmed that the pressure is preferably within a range of 1.33 to 6.65 Pa in order to conduct an etching process wherein the shoulder loss is small (that is, the etching selective ratio is high), the etching residue is less, and the top CD shift is small.

In addition, as shown in FIG. 27, when the bias power is increased, the shoulder loss tends to be increased and the absolute value of the top CD shift tends to be increased. However, when the bias power is 400 W (power density: 0.566 W/cm$^2$) or lower, the respective values of the shoulder loss and the top CD shift were within usable ranges. It is estimated that the shoulder loss becomes too large when the bias power exceeds 400 W. In addition, the etching rate tends to be increased when the bias power is increased.

From the above results, it was confirmed that: in order to enhance the etching selective ratio, to reduce the top CD shift, and to prevent generation of the etching residue, it is sufficient that the pressure in the chamber is 1.33 Pa to 6.65 Pa and the bias power density is not higher than 0.566 W/cm$^2$.

The present invention is not limited to the above embodiment, but may be variously modified. For example, in the above embodiment, as the magnetic-field generating means, the annular magnetic unit in the multi-pole state is used wherein the plurality of segment magnets consisting of permanent magnets are arranged annularly around the chamber. However, the present invention is not limited to this manner if a magnetic-field can be formed around the processing space to confine the plasma. In addition, the peripheral magnetic field for confining the plasma may be unnecessary. That is, the etching process can be conducted under a condition wherein there is no magnetic field. In addition, the present invention can be applied to a plasma etching process conducted in a crossed electromagnetic field wherein a horizontal magnetic field is applied to the processing space. In addition, in the above embodiment, the high-frequency electric power for generating plasma is applied to the lower electrode, but may be applied to the upper electrode. In the above embodiment, the low-k film is used as the organic-material film, but other films including O, C and H or other films including Si, O, C and H may be also used. In addition, the semiconductor wafer is taken as an example of the substrate to be processed. However, this invention is not limited thereto, but applicable to other plasma processes for an LCD substrate or the like. In addition, the above description is about the case wherein the organic-material film is etched by using the inorganic-material film as a mask, but this invention is not limited thereto. This invention is applicable to all cases to selectively etch an organic-material film with respect to an inorganic-material film. For example, this invention is applicable to an ashing process to remove a resist that has been used as a mask when an inorganic-material film, for example a $SiO_2$ film, formed on a substrate to be processed, for example a Si wafer or the like, is etched. The ashing process has to be conducted so as to selectively and efficiently remove the resist film being an organic-material film, with etching the inorganic-material film under the resist film as little as possible. Thus, if the present invention is applied to the ashing process, a good ashing characteristic can be achieved.

The invention claimed is:

1. A plasma etching method for etching an organic-material film on a substrate having the organic-material film and an inorganic-material film thereon, said method comprising:
   an arranging step of arranging first and second electrodes oppositely in a chamber and making the second electrode support the substrate to be processed in such a manner that the substrate is arranged between the first and second electrodes, and
   an etching step of applying a high-frequency electric power to the second electrode supporting the substrate to form a high-frequency electric field between the first and second electrodes, supplying a process gas into the chamber to form a plasma of the process gas by means of the electric field, and selectively plasma-etching the organic-material film of the substrate by means of the plasma while using the inorganic-material film to function as a mask, wherein said etching step further comprises
   setting the frequency of the high-frequency electric power applied to the second electrode to 70 to 150 MHz, and
   controlling a magnetic annular unit having a plurality of rotatable, segment magnets concentrically arranged around the chamber in such a manner that magnetic-pole directions of adjacent two segment magnets are opposite, and that a vertical gap is set between pairs of magnets so as to adjust a magnetic field by the segment magnets to confine the plasma to a region in the chamber,
   wherein in the etching step, a second high-frequency electric power of 500 kHz to 27 MHz is applied to the second electrode supporting the substrate, the second high-frequency electric power being overlapped with the high-frequency electric power.

2. The plasma etching method according to claim 1, wherein in the etching step, plasma density in the chamber is $5 \times 10^{10}$ to $2 \times 10^{11}$ $cm^{-3}$, and a self-bias electric voltage of the second electrode is not higher than 900 V.

3. The plasma etching method according to claim 1, wherein in the etching step, power density of the high-frequency electric power is 2.12 to 4.25 $W/cm^2$.

4. The plasma etching method according to claim 1, wherein in the etching step, a pressure in the chamber is 13.3 to 106.7 Pa.

5. The plasma etching method according to claim 1, wherein in the etching step, a pressure in the chamber is 1.33 to 6.67 Pa.

6. The plasma etching method according to claim 1, wherein a frequency of the second high-frequency electric power is 13.56 MHz.

7. The plasma etching method according to claim 1, wherein a frequency of the second high-frequency electric power is 3.2 MHz.

8. The plasma etching method according to claim 1, wherein power density of the second high-frequency electric power is not higher than 4.25 $W/cm^2$.

9. A plasma etching method for etching an organic-material film on a substrate having the organic-material film and an inorganic-material film thereon, said method comprising:
   an arranging step of arranging a first and second electrodes oppositely in a chamber and making the second electrode support the substrate to be processed in such a manner that the substrate is arranged between the first and second electrodes, and
   an etching step of applying a first high-frequency electric power to the second electrode supporting the substrate to form a high-frequency electric field between the first and second electrodes, supplying a process gas into the chamber to form a plasma of the process gas by means of the electric field, and selectively plasma-etching the organic-material film of the substrate by means of the plasma while using the inorganic-material film to function as a mask,
   wherein said etching step further comprises:
   providing a pressure in the chamber of 13.3 to 106.7 Pa, a frequency of the first high-frequency electric power at 70 to 150 MHz, and a power density of the first high-frequency electric power of 2.12 to 4.25 $W/cm^2$,
   applying a second high-frequency electric power also to the second electrode, the second high-frequency electric power being overlapped with the first high-frequency electric power,
   setting a frequency of the second high-frequency electric power to 500 kHz to 27 MHz, a power density of the second high-frequency electric power to not higher than 4.25 $W/cm^2$, a plasma density in the chamber at $5 \times 10^{10}$ to $2 \times 10^{11}$ $cm^{-3}$, and a self-bias electric voltage of the second electrode to not higher than 900 V, and
   controlling a magnetic annular unit having a plurality of rotatable, segment magnets concentrically arranged around the chamber in such a manner that magnetic-pole directions of adjacent two segment magnets are opposite, and that a vertical gap is set between pairs of magnets so as to adjust a magnetic field by the segment magnets to confine the plasma to a region in the chamber.

10. A plasma etching method for etching an organic-material film on a substrate having the organic-material film and an inorganic-material film thereon, said method comprising:
    an arranging step of arranging a first and second electrodes oppositely in a chamber and making the second electrode support the substrate to be processed in such a manner that the substrate is arranged between the first and second electrodes, and
    an etching step of applying a first high-frequency electric power to the second electrode supporting the substrate to form a high-frequency electric field between the first and second electrodes, supplying a process gas into the chamber to form a plasma of the process gas by means of the electric field, and selectively plasma-etching the organic-material film of the substrate by means of the plasma while using the inorganic-material film to function as a mask, wherein said etching step further comprises:

providing a pressure in the chamber of 1.33 to 6.67 Pa, a frequency of the first high-frequency electric power at 70 to 150 MHz, and a power density of the first high-frequency electric power of 2.12 to 4.25 W/cm$^2$, applying a second high-frequency electric power also to the second electrode, the second high-frequency electric power being overlapped with the first high-frequency electric power, setting a frequency of the second high-frequency electric power to 500 kHz to 27 MHz, a power density of the second high-frequency electric power to not higher than 0.566 W/cm$^2$, a plasma density in the chamber at $5 \times 10^{10}$ to $2 \times 10^{11}$ cm$^{-3}$, and a self-bias electric voltage of the second electrode to not higher than 400 V, and controlling a magnetic annular unit having a plurality of rotatable, segment magnets concentrically arranged around the chamber in such a manner that magnetic-pole directions of adjacent two segment magnets are opposite, and that a vertical gap is set between pairs of magnets so as to adjust a magnetic field by the segment magnets to confine the plasma to a region in the chamber.

11. The plasma etching method according to claim 1, wherein the organic-material film includes O, C and H.

12. The plasma etching method according to claim 1, wherein the organic-material film includes Si, O, C and H.

13. The plasma etching method according to claim 1, wherein the inorganic-material film comprises at least one of a silicon oxide, a silicon nitride or a silicon oxinitride.

14. The plasma etching method according to claim 1, wherein a distance between the pair of electrodes is shorter than 50 mm.

* * * * *